(12) United States Patent
Sato et al.

(10) Patent No.: US 11,219,122 B2
(45) Date of Patent: Jan. 4, 2022

(54) SENSOR UNIT AND STRUCTURAL HEALTH MONITORING

(71) Applicant: Seiko Epson Corporation, Tokyo (JP)

(72) Inventors: Kenta Sato, Shiojiri (JP); Yasushi Yoshikawa, Chino (JP)

(73) Assignee: Seiko Epson Corporation

( * ) Notice: Subject to any disclaimer, the term of this patent is extended or adjusted under 35 U.S.C. 154(b) by 375 days.

(21) Appl. No.: 16/381,082

(22) Filed: Apr. 11, 2019

(65) Prior Publication Data

US 2019/0320526 A1 Oct. 17, 2019

(30) Foreign Application Priority Data

Apr. 12, 2018 (JP) .............................. JP2018-076646

(51) Int. Cl.
*H05K 1/02* (2006.01)
*H05K 5/00* (2006.01)
(Continued)

(52) U.S. Cl.
CPC ............. *H05K 1/0278* (2013.01); *G01C 9/02* (2013.01); *H05K 1/0271* (2013.01); *H05K 1/181* (2013.01); *H05K 5/006* (2013.01); *H05K 5/0052* (2013.01); *H05K 5/0069* (2013.01); *H05K 5/0078* (2013.01); *H05K 2201/09027* (2013.01); *H05K 2201/10151* (2013.01)

(58) Field of Classification Search
CPC ...... H05K 1/02; H05K 1/0271; H05K 1/0278; H05K 1/18; H05K 1/181–187; H05K 5/00; H05K 5/0052; H05K 5/0069; H05K 5/0078; G01P 15/08; G01P 15/0802; G01P 15/18; G01P 15/123; G01C 9/02
USPC ................ 361/752–759, 782–784, 775, 803, 361/807–810; 439/76.1
See application file for complete search history.

(56) References Cited

U.S. PATENT DOCUMENTS

| 4,912,602 A | * | 3/1990 | Zurek | ................. H04B 1/3833 361/752 |
| 5,233,873 A | * | 8/1993 | Mozgowiec | ............ G01P 1/023 73/497 |

(Continued)

FOREIGN PATENT DOCUMENTS

| JP | H05-072227 A | 3/1993 |
| JP | 2001-099859 A | 4/2001 |

(Continued)

*Primary Examiner* — Tuan T Dinh
(74) *Attorney, Agent, or Firm* — Harness, Dickey & Pierce, P.L.C.

(57) ABSTRACT

A sensor unit includes a physical quantity sensor, a connecter to be coupled to the outside, a board on which the physical quantity sensor and the connecter are installed, and a container accommodating the board. The board is provided with a first region in which the connecter is installed, a second region in which the physical quantity sensor is installed, and a coupling region disposed between the first and second regions and having a sectional area S3 that is smaller than a sectional area S1 of the first region and a sectional area S2 of the second region in a sectional view as seen in a direction orthogonal to a direction in which the first region and the second region are arranged, and a region in the second region of the board on the coupling region side is attached to the container via a fixation member.

9 Claims, 17 Drawing Sheets

(51) Int. Cl.
*H05K 1/18* (2006.01)
*G01C 9/02* (2006.01)

(56) References Cited

U.S. PATENT DOCUMENTS

| | | | |
|---|---|---|---|
| 6,111,760 A * | 8/2000 | Nixon | H05K 5/0013 220/4.02 |
| 6,728,112 B1 * | 4/2004 | Qin | H04M 1/0277 361/740 |
| 7,142,433 B2 * | 11/2006 | Lechner | H05K 3/0058 361/797 |
| 8,112,196 B2 * | 2/2012 | Takayanagi | H05K 1/144 701/36 |
| 8,787,022 B2 * | 7/2014 | Moriai | H01L 23/552 361/720 |
| 2005/0066724 A1 | 3/2005 | Hiraoka et al. | |
| 2013/0201316 A1 * | 8/2013 | Binder | H04L 67/12 348/77 |
| 2014/0085839 A1 * | 3/2014 | Nakano | H05K 5/0052 361/752 |
| 2015/0040666 A1 * | 2/2015 | Saito | G01P 1/023 73/514.01 |
| 2015/0156896 A1 * | 6/2015 | Jeong | H01R 12/716 361/796 |
| 2017/0191832 A1 | 7/2017 | Kinoshita et al. | |

FOREIGN PATENT DOCUMENTS

| | | |
|---|---|---|
| JP | 2005-106584 A | 4/2005 |
| JP | 2007-080967 A | 3/2007 |
| JP | 2008-203072 A | 9/2008 |
| JP | 2009-210498 A | 9/2009 |
| JP | 2010-071724 A | 4/2010 |
| JP | 2010-231895 A | 10/2010 |
| JP | 2016-023931 A | 2/2016 |

* cited by examiner

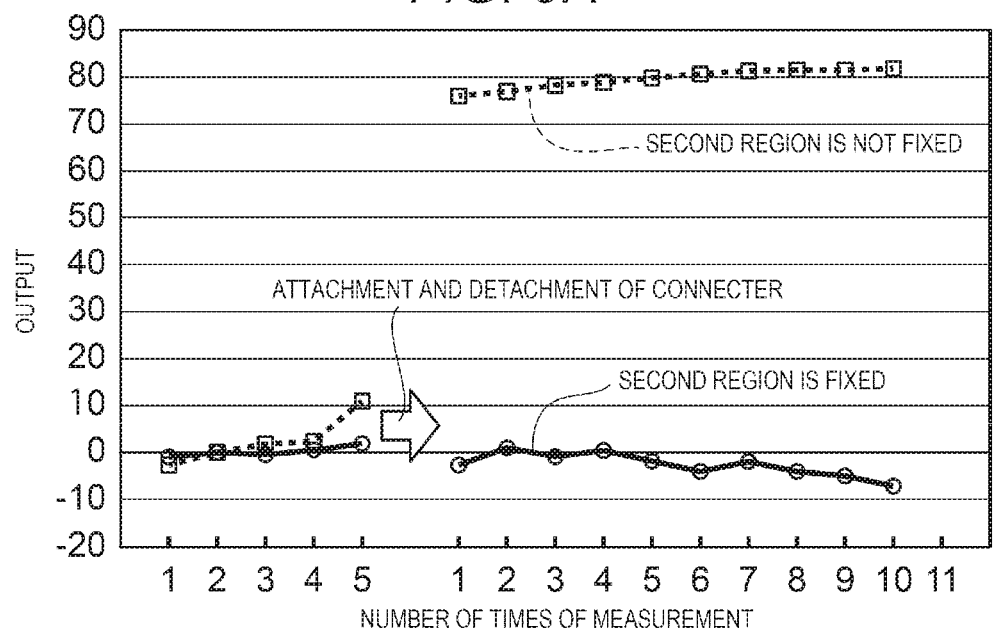
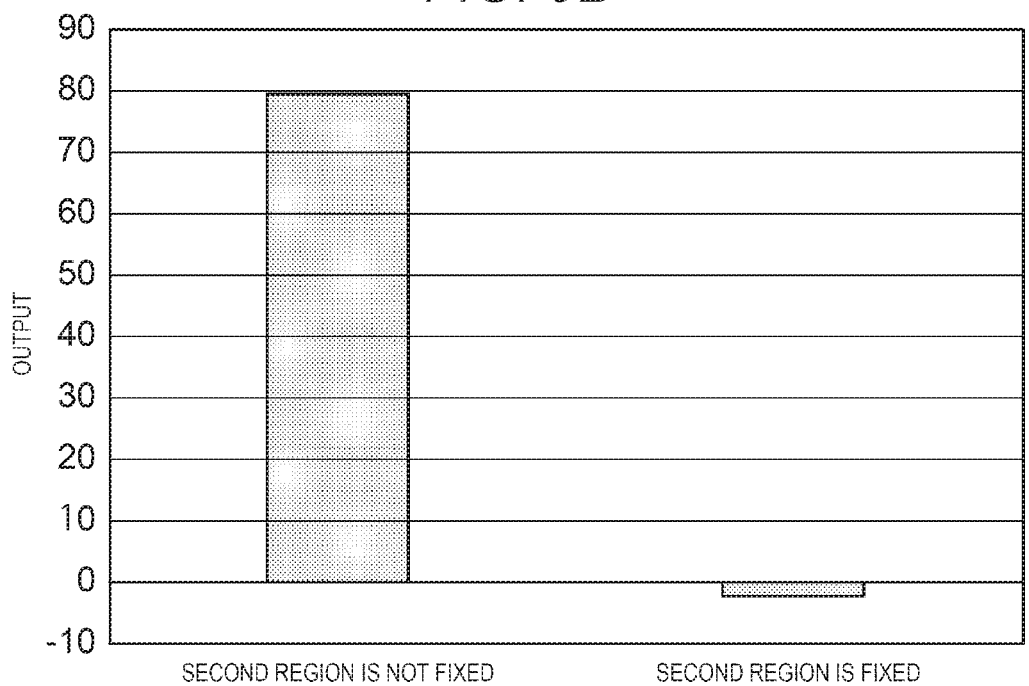

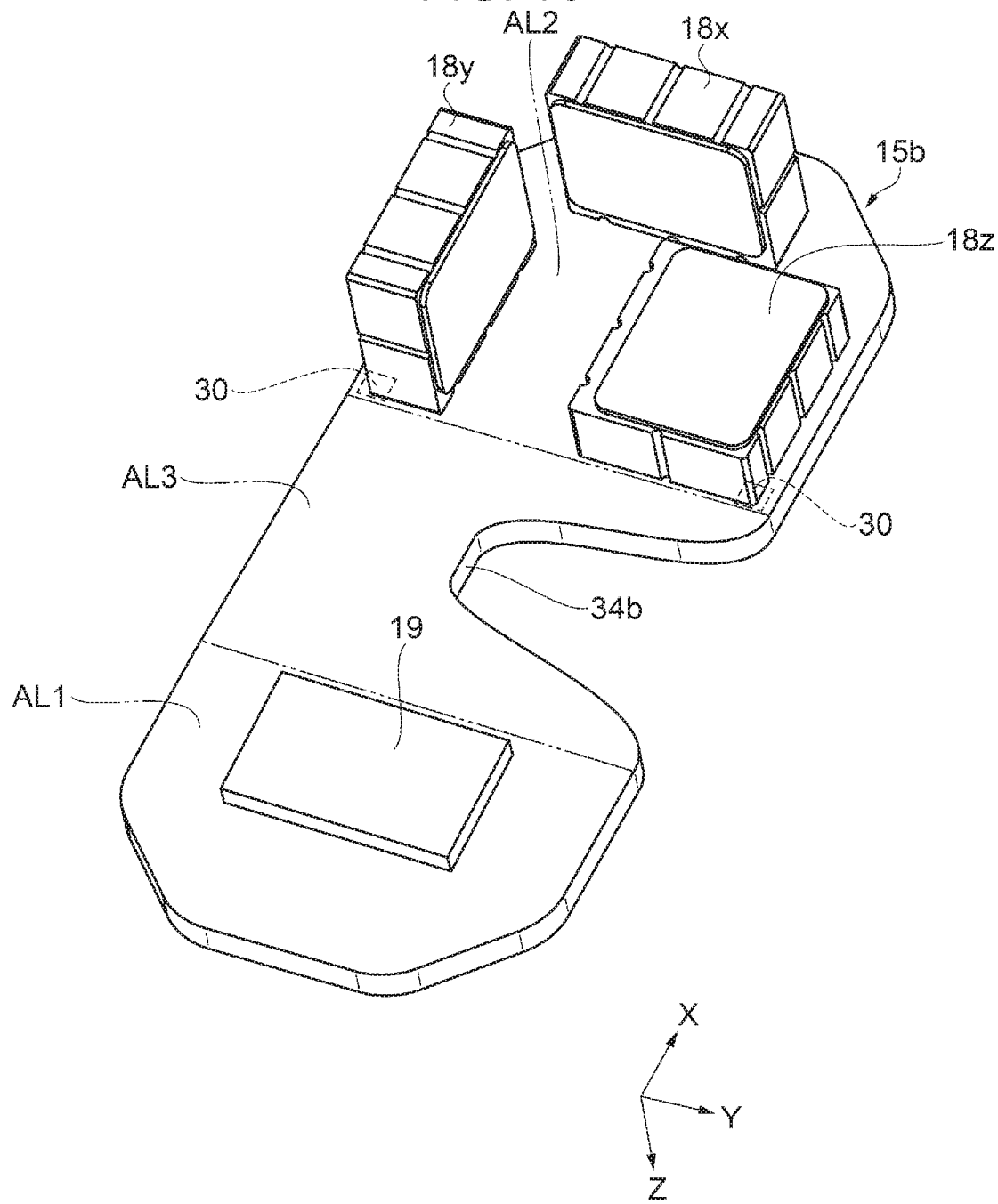

SENSOR UNIT AND STRUCTURAL HEALTH MONITORING

The present application is based on and claims priority from JP Application Serial Number 2018-076646, filed Apr. 12, 2018, the disclosure of which is hereby incorporated by reference herein in its entirety.

BACKGROUND

1. Technical Field

The present disclosure relates to a sensor unit and a structural health monitoring.

2. Related Art

In the related art, a sensor unit that is provided with an inertial sensor such as an acceleration sensor or an angular velocity sensor as a physical quantity sensor has been known. The sensor unit can function as a motion sensor unit and examples thereof include an inclination sensor unit (inclinometer) which is installed on a structure such as a building and a highway, an inclined surface of a mountain, a retaining wall surface of an embankment, or the like and an inertial measurement unit (IMU) which measures the posture or the behavior (inertia momentum) of a moving object (mounting target device) such as an agricultural machine, a construction machine, an automobile, a drone, and a robot.

As such a sensor unit, for example, a sensor unit that functions as a so-called six-axis motion sensor provided with an acceleration sensor for three axes and an angular velocity sensor for three axes is described in JP-A-2016-23931.

Meanwhile, in recent years, a higher sensitivity and a higher accuracy are required for a sensor unit.

However, in the case of the sensor unit disclosed in JP-A-2016-23931, a connecter, the acceleration sensor, and the angular velocity sensor are attached to one circuit board that constitutes the sensor unit. Therefore, there is a problem that a stress caused by attachment and detachment between a male connecter and a female connecter constituting the connecter or a stress caused by the connecter itself influences a detection signal detected by the sensor unit.

SUMMARY

A sensor unit according to an aspect of the present application includes a physical quantity sensor, a connecter to be coupled to a bonding target portion, a board on which the physical quantity sensor and the connecter are installed, and a container accommodating the board. The board is provided with a first region in which the connecter is installed, a second region in which the physical quantity sensor is installed, and a coupling region that is disposed between the first region and the second region and has a sectional area S3 that is smaller than a sectional area S1 of the first region and a sectional area S2 of the second region in a sectional view as seen in a direction in which the first region and the second region are arranged, and a region in the second region which is on the coupling region side is attached to the container via a fixation member.

In the sensor unit, the coupling region may be a constriction portion at which an outer edge of the board extending in a first direction, in which the first region and the second region are arranged, is constricted, as seen in a plan view.

In the sensor unit, the constriction portion may be provided on each of opposite sides of the board in a second direction orthogonal to the first direction, as seen in a plan view.

In the sensor unit, the coupling region may be a thin portion at which a thickness of an outer edge region of the board extending in a first direction, in which the first region and the second region are arranged, is smaller than that of another region, as seen in a plan view.

In the sensor unit, the thin portion may be provided on each of opposite sides of the board in a second direction orthogonal to the first direction, as seen in a plan view.

In the sensor unit, the coupling region may be provided with a through-hole that is disposed in an outer edge region of the board extending in a first direction, in which the first region and the second region are arranged, as seen in a plan view.

In the sensor unit, the through-hole may be provided on each of opposite sides of the board in a second direction orthogonal to the first direction, as seen in a plan view.

In the sensor unit, a region of the board that surrounds an outer edge of the connecter as seen in a plan view may be attached to the container via the fixation member.

In the sensor unit, the fixation member may be an epoxy-based adhesive.

In the sensor unit, the coupling region of the board that is attached to the container via the fixation member may be fixed with a screw.

In the sensor unit, the physical quantity sensor may measure at least any of acceleration and angular velocity.

A structure health monitoring device according to an aspect of the present application includes the above-described sensor unit, a receiver receiving a detection signal from the sensor unit attached to a structure, and a calculator calculating an inclination angle of the structure based on a signal output from the receiver.

BRIEF DESCRIPTION OF THE DRAWINGS

FIG. 9A is a graph illustrating the state of output of an acceleration sensor at the time of attachment and detachment of a connecter.

FIG. 9B is a graph illustrating a change in output of the acceleration sensor caused by attachment and detachment of the connecter.

FIG. 10 is an external appearance perspective view illustrating Modification Example 1 of the shape of the board (circuit board).

DESCRIPTION OF EXEMPLARY EMBODIMENTS

Hereinafter, an embodiment will be described. Note that, the embodiment described below does not unduly limit the scope of the present disclosure as stated in the appended claims. In addition, all of the elements described in the embodiment should not necessarily be taken as essential elements of the present disclosure.

Sensor Unit
Outline of Sensor Unit

Figure 1:
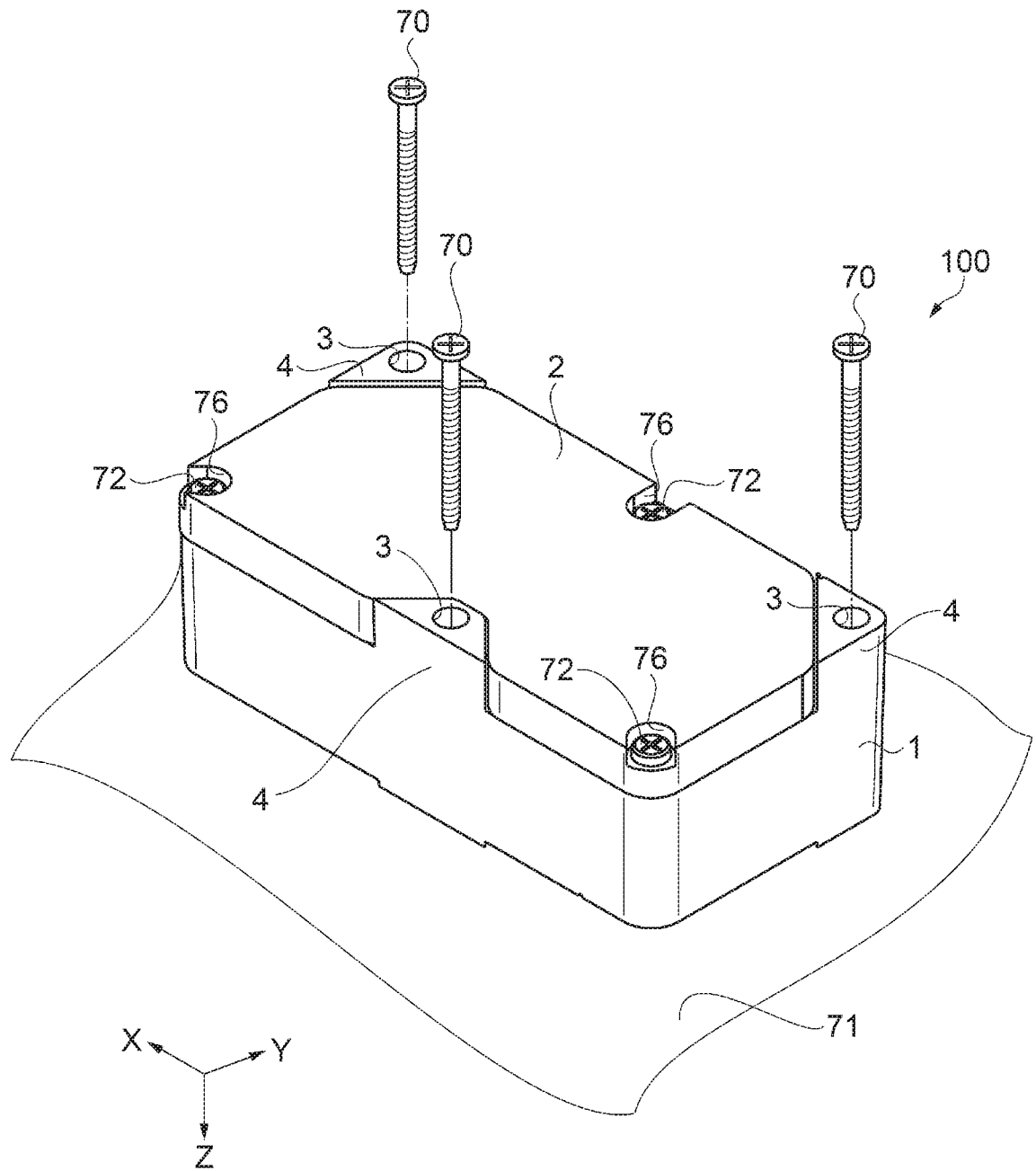
FIG. 1 is a perspective view illustrating a state where a sensor unit is fixed to a mounting target surface.
Figure 2:
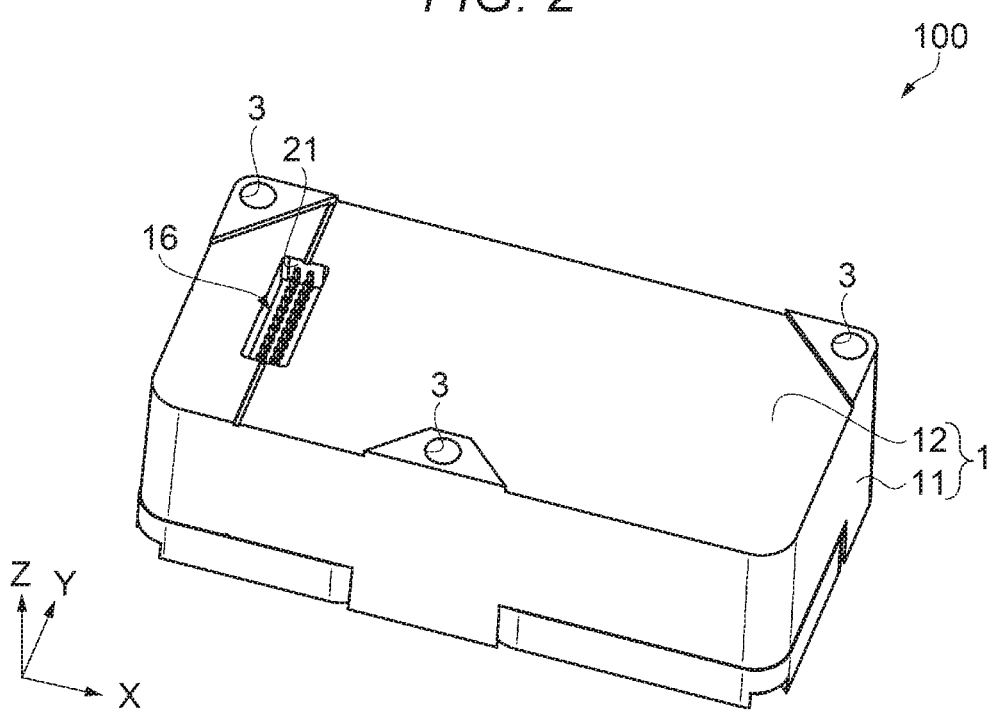
FIG. 2 is a perspective view illustrating an outline of the sensor unit as seen from the mounting target surface side of FIG. 1.

First, the outline of a sensor unit will be described with reference to FIGS. 1 and 2. FIG. 1 is a perspective view illustrating a state where a sensor unit according to an embodiment is fixed to a mounting target surface. FIG. 2 is a perspective view illustrating the outline of the sensor unit as seen from the mounting target surface side of FIG. 1.

A sensor unit 100 illustrated in FIG. 1 is an inertial measurement unit which measures the posture or the behavior (inertia momentum) of a moving object (mounting target device) such as an automobile, an agricultural machine, a construction machine, a robot, and a drone. The sensor unit 100 functions as a so-called three-axis motion sensor which is provided with three acceleration sensors as physical quantity sensors, each of the three acceleration sensors measuring acceleration along one axis.

The sensor unit 100 has a rectangular parallelepiped shape of which the planar shape is rectangular. The length of a longer side of the sensor unit 100 in a first direction (X axis direction) is approximately 50 mm, the length of a shorter side of the sensor unit 100 in a second direction (Y axis direction) orthogonal to the first direction is approximately 24 mm, and the thickness of the sensor unit 100 is approximately 16 mm. Fixation projections 4 are provided at two positions near the opposite end portions of one longer side of the sensor unit 100 and one position on the central portion of the other longer side and a screw hole 3 is formed in each of the fixation projections 4. Fixation screws 70 are respectively inserted into the three screw holes 3 and the sensor unit 100 is used in a state of being fixed to a mounting target surface 71 of a structure (device) as a bonding target portion such as a bridge or a notice board, for example. Note that, the above-described size related to the sensor unit 100 is merely an example and the size of the sensor unit 100 can be reduced to such a size that the sensor unit 100 can be installed in a head-mounted display (HMD) (smart glasses), a smart phone, or a digital camera through selection of components or a change in design. Note that, an opening of the sensor unit 100 which is on a side opposite to the mounting target surface 71 is covered with a lid 2 which is disposed being guided by the fixation projections 4. Note that, the lid 2 is fixed to a container 1 via a sealing member 41 (refer to FIG. 3) with screws 72 inserted into three through-holes 76 including recesses (dredged portions).

As illustrated in FIG. 2, a surface of the sensor unit 100 that is on the mounting target surface side is provided with an opening 21. In the opening 21, a plug-type (male) connecter 16 is disposed. The connecter 16 is provided with a plurality of pins arranged in two rows and the plurality of pins are arranged in the second direction (Y axis direction) in each row. A socket-type (female) connecter (not shown) from a mounting target device is coupled to the plug-type (male) connecter 16 and a drive voltage for the sensor unit 100 or electric signals of detection data or the like is transmitted and received therebetween. Note that, the plug-type (male) connecter 16 is attached to a circuit board 15 (refer to FIG. 5) as a board, which will be described later.

Note that, in the following description, a direction parallel to a longer side of the sensor unit 100, which is rectangular in a plan view, will be referred to as the first direction (X axis direction). In addition, a direction (direction parallel to shorter side) orthogonal to the first direction (X axis direction) in a plan view will be referred to as the second direction (Y axis direction). In addition, the thickness direction of the sensor unit 100 will be referred to as a third direction (Z axis direction).

For the sensor unit 100, a characteristic package configuration is adopted in order to reduce the influence of a stress caused by plugging and unplugging (attachment and detachment) between the plug-type (male) connecter 16 provided in the opening 21 and the socket-type (female) connecter (not shown) coupled to the plug-type (male) connecter 16 or a stress caused by the plug-type (male) connecter 16 itself on a detection signal detected by the sensor unit. According to the configuration, a higher reliability and a higher stability in detection accuracy are realized in comparison with a sensor unit in the related art. Hereinafter, the characteristic package configuration will be described in detail. Note that, the configuration is not limited to a three-axis motion sensor and can be applied to any unit or device provided with a physical quantity sensor (inertial sensor).

Configuration of Sensor Unit

Figure 3:
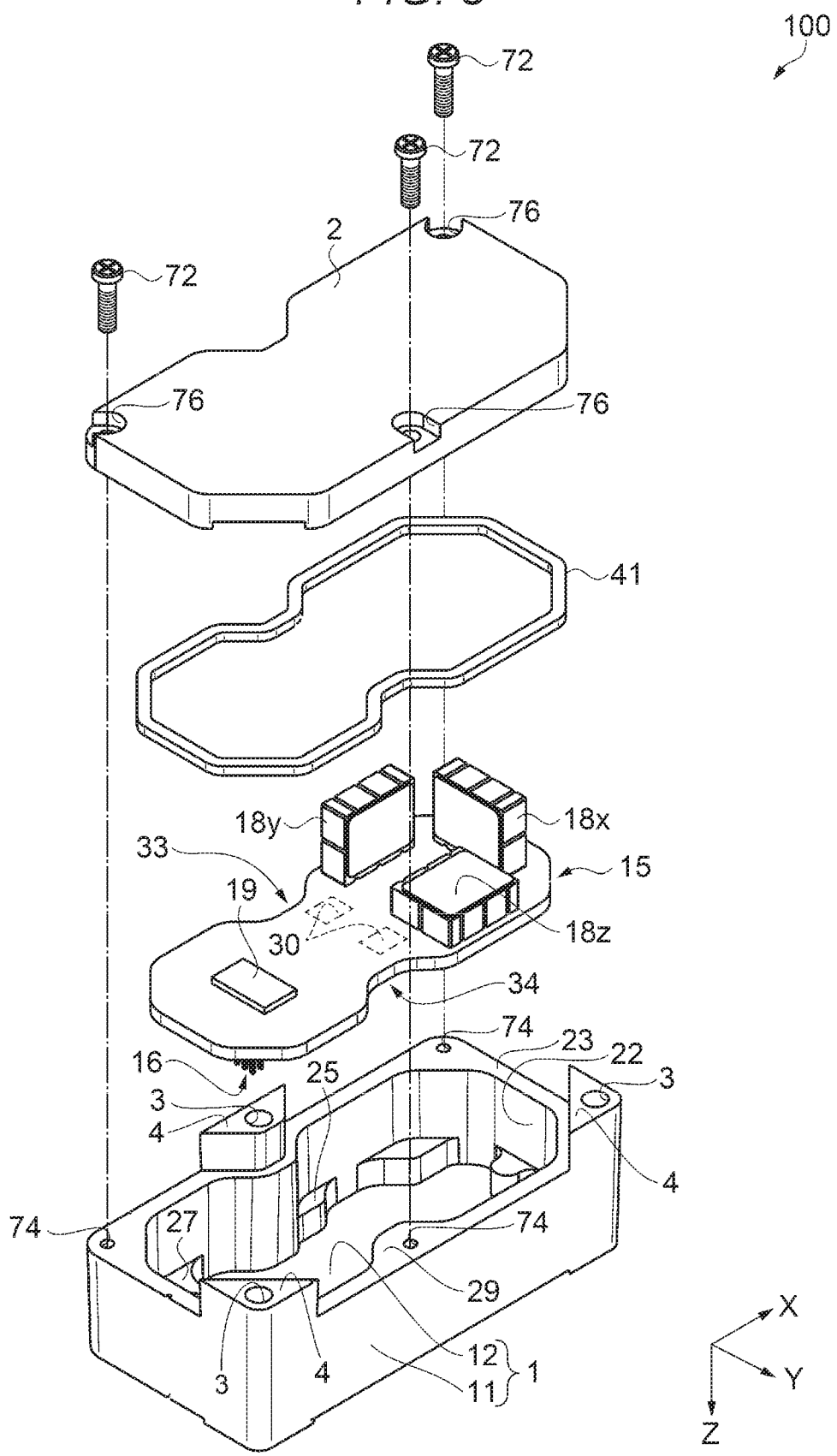
FIG. 3 is an exploded perspective view of the sensor unit in the same state as in FIG. 1.
Figure 4:
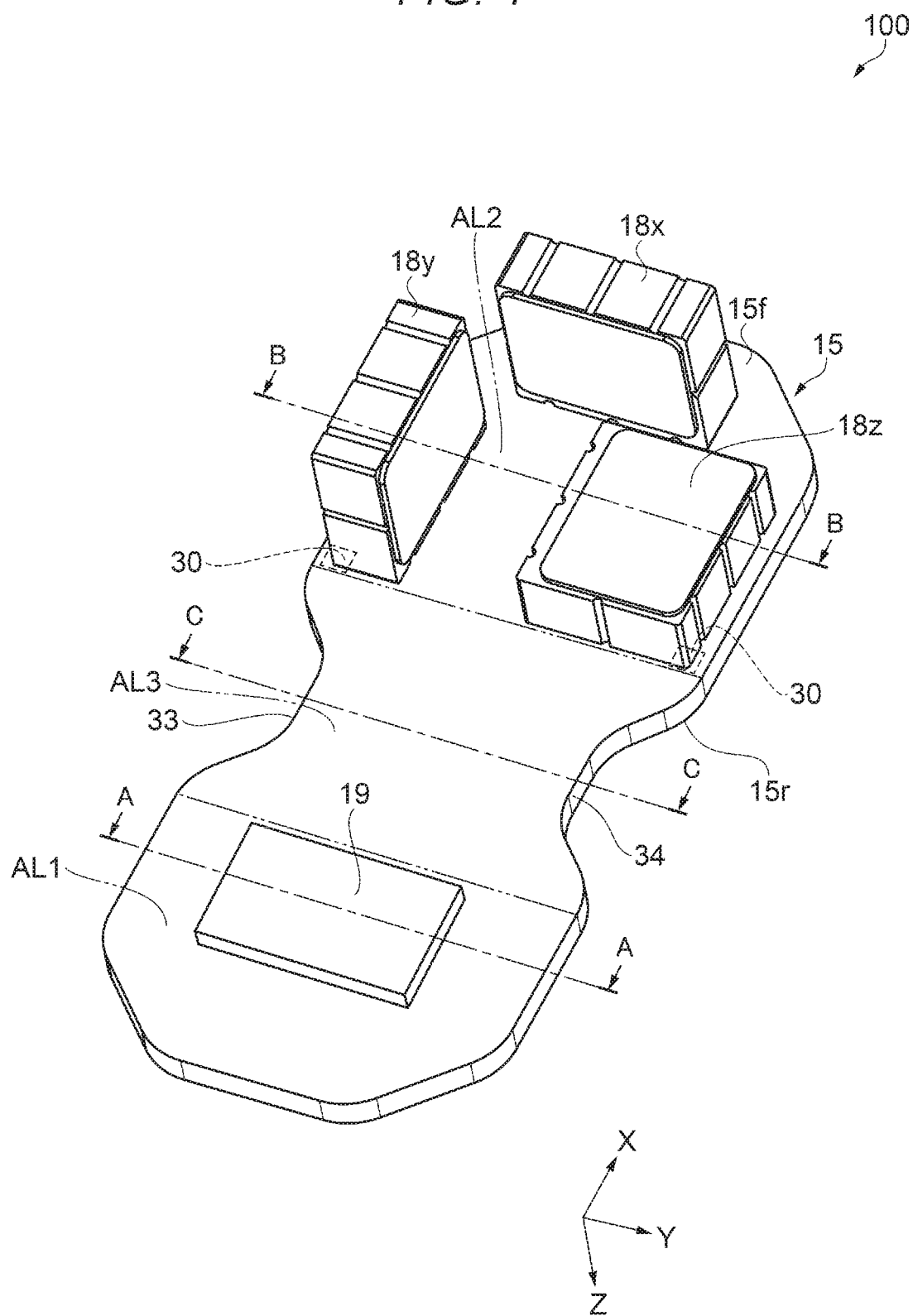
FIG. 4 is an external appearance perspective view illustrating a schematic configuration of a board (circuit board) as seen in the same direction as in FIG. 3.
Figure 5:
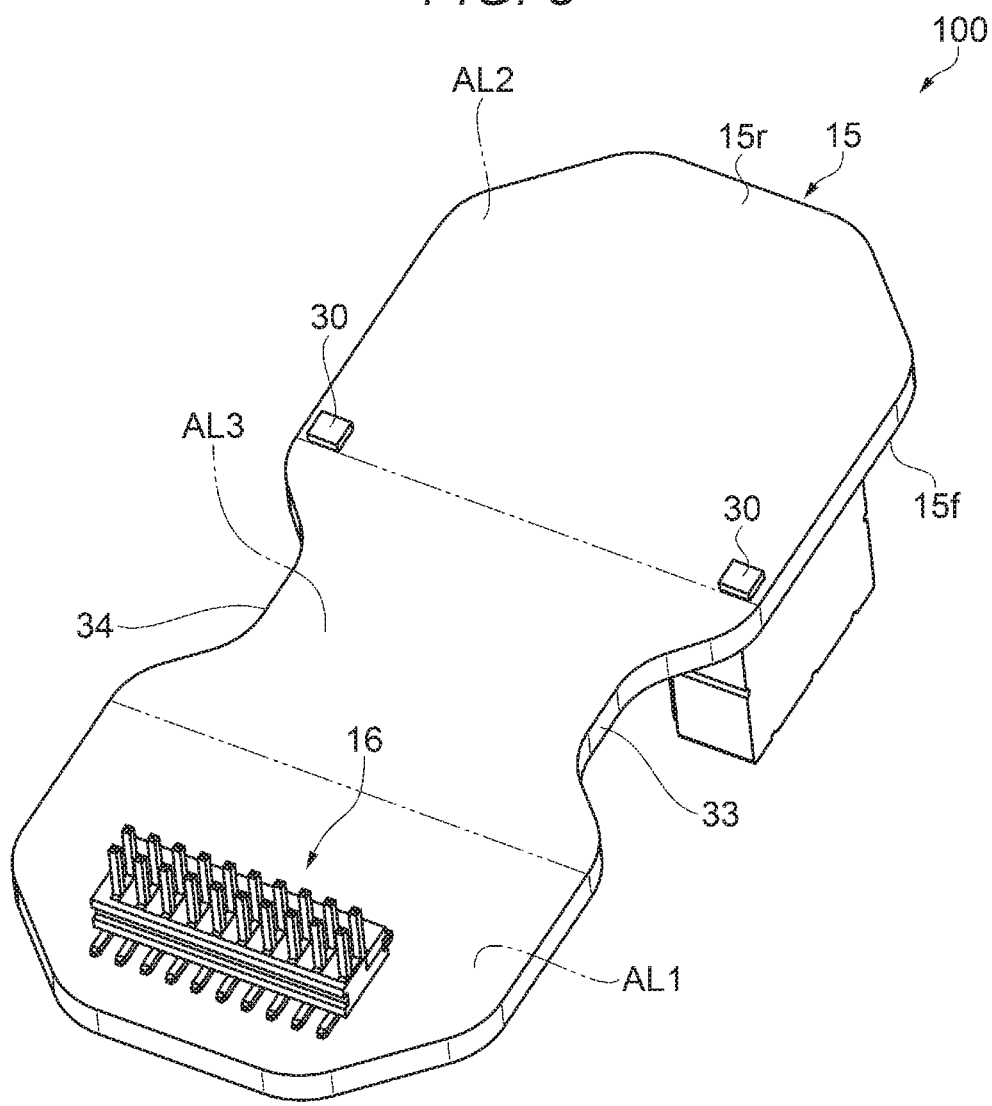
FIG. 5 is an external appearance perspective view illustrating a schematic configuration of the board (circuit board) as seen in a direction opposite to that in FIG. 4.
Figure 6A:
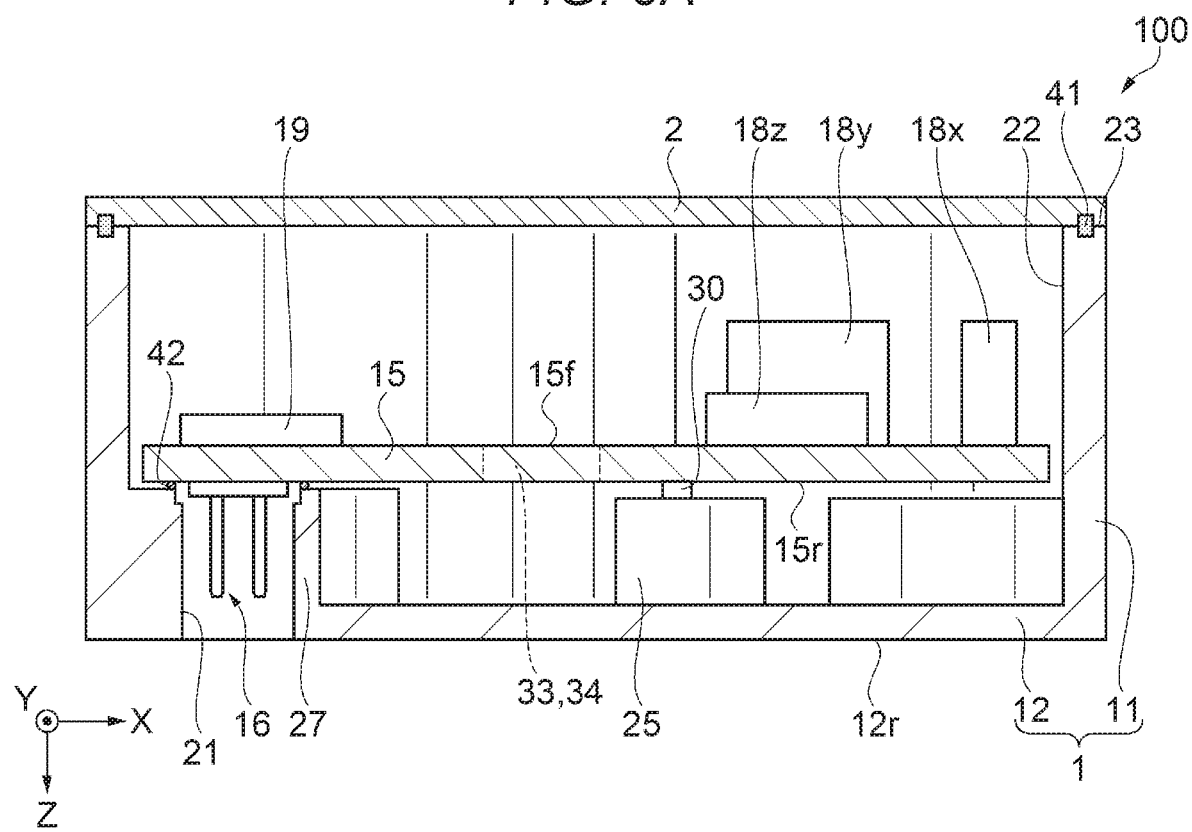
FIG. 6A is a sectional view illustrating an outline of the sensor unit.
Figure 6B:
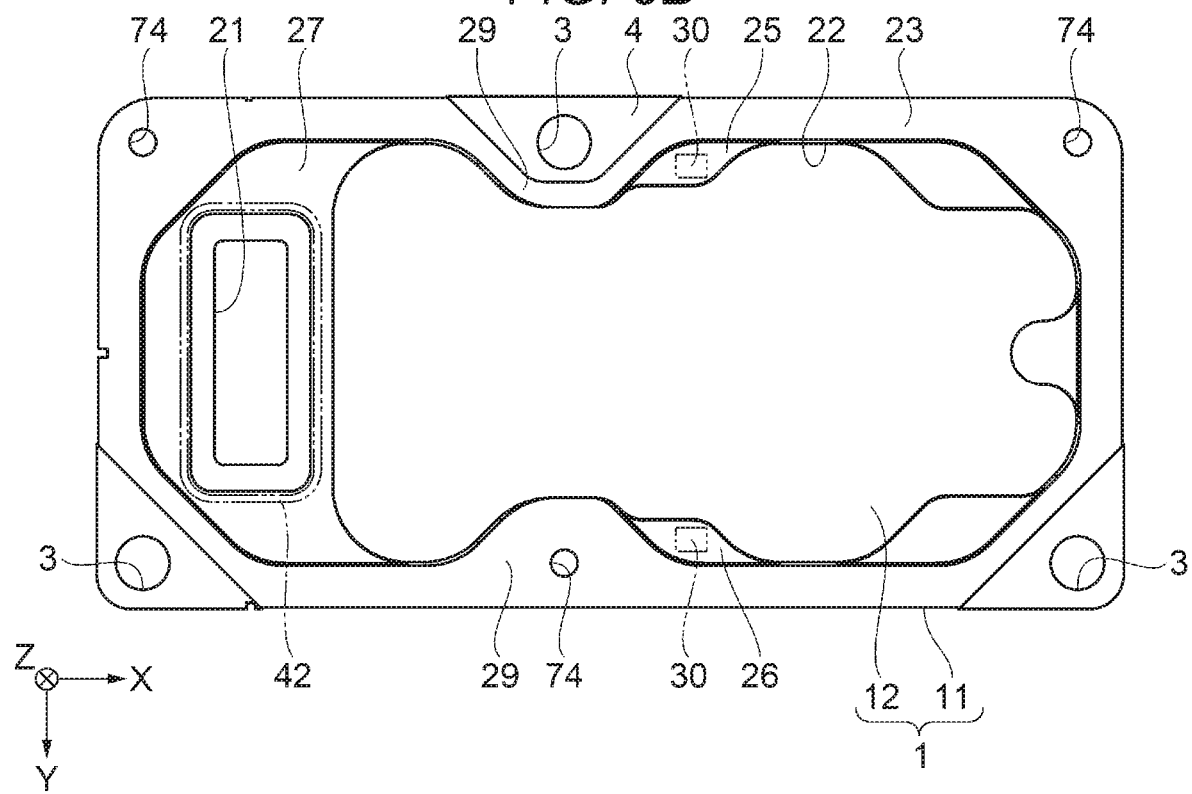
FIG. 6B is a plan view illustrating an outline of the container.

Next, a configuration of the sensor unit will be described with reference to FIGS. 3, 4, 5, 6A, and 6B in addition to FIGS. 1 and 2. FIG. 3 is an exploded perspective view of the sensor unit in the same state as in FIG. 1. FIG. 4 is an external appearance perspective view illustrating a schematic configuration of the board (circuit board) as seen in the same direction as in FIG. 3. FIG. 5 is an external appearance perspective view illustrating a schematic configuration of the board (circuit board) as seen in a direction opposite to that in FIG. 4. FIG. 6A is a sectional view illustrating an outline of the sensor unit. FIG. 6B is a plan view illustrating an outline of the container.

As illustrated in FIG. 3, the sensor unit 100 is configured of the container 1, the lid 2, the sealing member 41, the circuit board 15 as a board, or the like. More specifically, the sensor unit 100 is configured such that the circuit board 15 is attached into the container 1 with fixation members 30 and 42 (refer to FIGS. 6A and 6B) interposed therebetween and the opening of the container 1 is covered with the lid 2 via the sealing member 41.

The container 1 is molded into a box shape having an internal space by using, for example, aluminum and is a member as a container accommodating the circuit board 15. The container 1 can be cut from a base material or can be formed through die casting (metal mold casting). Note that, the material of the container 1 is not limited to aluminum and other metals such as zinc and stainless steel, resin, a composite material of metal and resin, or the like may also be used. The outer shape of the container 1 is a rectangular parallelepiped shape of which the planar shape is approximately rectangular as with the entire shape of the sensor unit 100 and the fixation projections 4 are provided at two positions near the opposite end portions of one longer side of the container 1 and one position on the central portion of the other longer side and the screw hole 3 is formed in each of the fixation projections 4. Here, each of the fixation projections 4 that are provided at two positions near the opposite end portions of the one longer side includes an intersection portion between a shorter side and a longer side and is approximately triangular as seen in a plan view. In addition, the fixation projection 4 that is provided at the one position on the central portion of the other longer side has an approximately trapezoidal shape that faces the internal space of the container 1 in a plan view.

Note that, structures related to fixation of the container 1 are not limited to the screw holes 3. For example, a configuration in which a cutout that can be fastened with a screw is formed (structure where cutouts are formed in fixation projections 4 on corner portions of the container 1 in which screw holes 3 are disposed or fixation projection 4 on central portion in which screw hole 3 is disposed) and the cutout is fastened with the screw or a configuration in which a flange (ear) is formed on a side surface of the container 1 and the flange is fastened with a screw may also be adopted. However, in the case of the former configuration in which a cutout hole is fastened with the screw as a fixation portion, when the cutout of the cutout hole is wider than the diameter of the head of the screw, the screw may be inclined with the head thereof deviating from the cutout when the cutout is fastened with the screw and there is a possibility that the cutout fastened with the screw becomes likely to be released or a cutout hole portion of an outer case is deformed or scraped due to the deviation of the screw. Therefore, when providing a cutout hole as a fixation portion, it is preferable that a cutout of the cutout hole is narrower than the diameter of the head of a screw constituting a seat surface.

The outer shape of the container 1 is a rectangular parallelepiped shape and a box shape open to one side. The inside of the container 1 is the internal space (accommodation space) surrounded by a bottom wall 12 and side walls 11. In other words, the container 1 has a box shape of which one surface facing the bottom wall 12 is an opening surface 23, an outer edge of the circuit board 15 is disposed (accommodated) along inner surfaces 22 of the side walls 11, and the lid 2 is fixed to cover the opening. Here, the opening surface 23 facing the bottom wall 12 is a surface on which the lid 2 is mounted. On the opening surface 23, the fixation projections 4 are erected at two positions near the opposite end portions of one longer side of the container 1 and one position on the central portion of the other longer side. In addition, upper surfaces (surfaces exposed in −Z direction) of the fixation projections 4 are approximately the same surfaces as an upper surface of the container 1.

In addition, as illustrated in FIGS. 6A and 6B, in the internal space (accommodation space) of the container 1, a projection 29 that protrudes from the side wall 11 to the internal space side over an area from the bottom wall 12 to the opening surface 23 is provided near a central portion of the one longer side which faces the fixation projection 4 provided on the central portion of the other longer side. In an upper surface (same surface as opening surface 23) of the projection 29, a female screw 74 for fixation of the lid 2 is provided. Here, the fixation projection 4 provided on the central portion of the other longer side may protrude from the side wall 11 to the internal space side over an area from the bottom wall 12 to the opening surface 23, as with the projection 29. Note that, the projection 29 and the fixation projection 4 are provided to face constriction portions 33 and 34 (refer to FIG. 4) of the circuit board 15, which will be described later.

In addition, in the internal space (accommodation space) of the container 1, a first pedestal 27 and second pedestals 25 and 26 that protrude from the bottom wall 12 to the opening surface 23 side to form step-like shapes higher than the bottom wall 12 are provided. As illustrated in FIGS. 6A and 6B, the first pedestal 27 is provided to face a disposition region for the plug-type (male) connecter 16 attached to the circuit board 15 and is provided with the opening 21 into which the plug-type (male) connecter 16 is inserted. The first pedestal 27 functions as a pedestal for fixing the circuit board 15 to the container 1 by means of the fixation member 42 disposed in the vicinity of the plug-type (male) connecter 16. Note that, the opening 21 penetrates a surface inside the first pedestal 27 and a lower surface 12r, which is an outer surface of the container 1. That is, the opening 21 penetrates the inside and the outside of the container 1.

The second pedestals 25 and 26 are positioned opposite to the first pedestal 27 with respect to the fixation projection 4 positioned on the central portion of the longer side and the projection 29 and are provided near the fixation projection 4 and the projection 29. Note that, the second pedestals 25 and 26 may be connected to any of the fixation projection 4 and the projection 29. The second pedestals 25 and 26 function as pedestal for fixing the circuit board 15 to the container 1 on a side opposite to the first pedestal 27 with respect to the fixation projection 4 and the projection 29.

Note that, an example in which the outer shape of the container 1 is a rectangular parallelepiped shape of which the planar shape is approximately rectangular and is a box-like shape without a lid has been described above. However, the present disclosure is not limited thereto and the planar shape of the outer shape of the container 1 may be square. Alternatively, the planar shape may be a polygonal shape such as a hexagonal shape or an octagonal shape, a corner of a vertex of the polygonal shape may be chamfered, and may be a planar shape of which each side is a curved line. In addition, the planar shape of the inside of the container 1 is not limited to the shape described above and may be another shape. In addition, the outer shape of the container 1 and the planar shape of the inside of the container 1 may be similar to each other or not.

The circuit board 15 as the board is a multilayer board in which a plurality of through-holes or the like are formed and a glass epoxy board is used as the circuit board 15. Note that, the circuit board 15 is not limited to a glass epoxy board and may be any rigid board as long as a plurality of physical quantity sensors, an electric component, a connecter, or the like can be mounted thereon. For example, a composite board or a ceramic board may also be used.

As illustrated in FIGS. 4 and 5, the circuit board 15 is provided with a second surface 15r on the bottom wall 12 side and a first surface 15f opposite to the second surface 15r. The circuit board 15 can be divided into a first region AL1 in which the plug-type (male) connecter 16 is installed, a second region AL2 in which acceleration sensors 18x, 18y, and 18z as physical quantity sensors are installed, and a coupling region AL3 positioned between the first region AL1 and the second region AL2. Note that, the circuit board 15 is provided with various wires and terminal electrodes (not shown) but description thereof will be omitted.

As illustrated in FIG. 5, the plug-type (male) connecter 16 is mounted on the second surface 15r in the first region AL1 of the circuit board 15. In addition, as illustrated in FIG. 4, the three acceleration sensors 18x, 18y, and 18z are mounted on the first surface 15f in the second region AL2 of the circuit board 15 and a control IC 19 is mounted on the first surface 15f in the first region AL1.

A central portion of the circuit board 15 in the first direction (X axis direction) is provided with constriction portions 33 and 34 at which the outer edge of the circuit board 15 is constricted in a plan view, the first direction being a direction along the longer side of the container 1. The constriction portions 33 and 34 are provided on opposite sides of the circuit board 15 in the second direction (Y axis direction) orthogonal to the first direction, are constricted in a direction from the outer edge of the circuit board 15 to the center in a plan view, and are provided to face the projection 29 and the fixation projection 4 (refer to FIG. 3) of the container 1. In addition, a region in which the constriction portions 33 and 34 are provided is the coupling region AL3. Therefore, the coupling region AL3 is provided to have a sectional area S3 (sectional area of section C-C in FIG. 4) that is smaller than a sectional area S1 of a section A-A of the first region AL1 in FIG. 4 and a sectional area S2 of a section B-B of the second region AL2 in FIG. 4 as seen in the first direction (X axis direction) in which the first region AL1 and the second region AL2 are arranged, the sections being sections parallel to the second direction (Y axis direction) orthogonal to the first direction. In other words, the coupling region AL3 can be a region in the constriction portions 33 and 34 of the circuit board 15 from a position on the first region AL1 side at which the outer edge starts to be constricted to a position on the second region AL2 side at which the outer edge starts to be constricted (region between two two-dot chain lines in FIG. 5).

The circuit board 15 is inserted into the internal space of the container 1 with the second surface 15r facing the first pedestal 27 and the second pedestals 25 and 26. In addition, the circuit board 15 is attached to the container 1 by means of the fixation member 42 that is disposed on the first pedestal 27 and is disposed in a ring shape in the vicinity of the plug-type (male) connecter 16 within a region surrounding an outer edge of the attached plug-type (male) connecter 16 and the fixation members 30 that are disposed on the second pedestals 25 and 26. That is, the circuit board 15 is attached to the first pedestal 27 and the second pedestals 25 and 26 of the container 1 via the fixation members 42 and 30 in the vicinity of the plug-type (male) connecter 16 in the first region AL1 and a region in the second region AL2 that is on the coupling region AL3 side.

Since the fixation member 42 is disposed in a ring shape in the vicinity of the connecter 16, airtightness between the container 1 and the circuit board 15 can be secured in the vicinity of the connecter 16. Therefore, a foreign matter such as dust from the vicinity of the connecter 16 exposed to the outside can be prevented from intruding into the container 1.

As described above, the circuit board 15 is fixed to the container 1 (second pedestals 25 and 26) via the fixation member 30 at a region in the second region AL2 that is on the coupling region AL3 side. Therefore, a stress generated on the first region AL1 side can be released due to bending of the coupling region AL3 of which the sectional area S3 is small. Specifically, since the constriction portions 33 and 34 are provided, the sectional area S3 of the coupling region AL3 is smaller than the sectional area S1 of the first region AL1 in which the connecter 16 is mounted and the sectional area S2 of the second region AL2 in which the acceleration sensors 18x, 18y, and 18z are mounted. In addition, the circuit board 15 is attached to the second pedestals 25 and 26 of the container 1 via the fixation members 30 at a region in the second region AL2 that is on the coupling region AL3 side. Therefore, a stress attributable to bending or the like of the circuit board 15 that is caused by plugging and unplugging (attachment and detachment) between the plug-type (male) connecter 16 mounted in the first region AL1 and the socket-type (female) connecter (not shown) is released due to bending of the coupling region AL3 of which the sectional area is small and which is likely to be bent and thus transmission of the stress to the second region AL2 side, on which the acceleration sensors 18x, 18y, and 18z are mounted, can be suppressed. Accordingly, it is possible to suppress influence on detection accuracy which is generated when a stress caused by plugging and unplugging (attachment and detachment) between the plug-type (male) connecter 16 and the socket-type (female) connecter (not shown) or disposition of the connecter 16 is transmitted to the acceleration sensors 18x, 18y, and 18z.

Note that, the fixation members 30 and 42 are preferably formed of an epoxy-based adhesive. When the fixation members 30 and 42 are formed of an epoxy-based adhesive of which the elastic modulus is smaller than that of the container 1, it is possible to cause the fixation members 30 and 42 to function as vibration proof members and thus an impact or vibration transmitted to the circuit board 15 as noise vibration after being applied to the container 1 can be suppressed. Here, for the fixation members 30 and 42, a so-called elastic adhesive having a smaller elastic modulus than that of the container 1 such as a silicone adhesive, a modified silicone adhesive, a polyimide adhesive, a urethane adhesive, or the like can also be used instead of the epoxy-based adhesive.

The plug-type (male) connecter 16 is provided with coupling terminals which are arranged at regular pitches in the Y axis direction and are arranged in two rows in the X axis direction. Preferably, ten pins constitute one row and the number of the coupling terminals is twenty in total. However, the number of the coupling terminals may be appropriately changed according to the design and specification.

Each of the acceleration sensors 18x, 18y, and 18z as physical quantity sensors can measure acceleration in one axis direction. As each of the acceleration sensors 18x, 18y, and 18z, preferably, a vibration type acceleration sensor in which a crystal is used as a vibrator and which measures acceleration based on a resonant frequency changed by a force applied to the vibrator is used. Note that, the acceleration sensors 18x, 18y, and 18z will be described later.

The acceleration sensor 18x is erected with a side surface thereof facing the first surface 15f of the circuit board 15 such that front and rear surfaces of a package face the X axis direction and the acceleration sensor 18x measures acceleration applied in the X axis direction. The acceleration sensor 18*y* is erected with a side surface thereof facing the first surface 15*f* of the circuit board 15 such that front and rear surfaces of a package face the Y axis direction and the acceleration sensor 18*y* measures acceleration applied in the Y axis direction. The acceleration sensor 18*z* is coupled such that front and rear surfaces of a package face the Z axis direction, that is, the front and rear surfaces face the first surface 15*f* of the circuit board 15 and the acceleration sensor 18*z* measures acceleration applied in the Z axis direction.

Note that, the acceleration sensors 18*x*, 18*y*, and 18*z* are not limited to a vibration type acceleration sensor which use a crystal and may be any type of sensor as long as acceleration can be measured. The other sensors may be, for example, a capacitance type acceleration sensor which is obtained by processing a silicon board by using the MEMS technology, a piezo-resistance type acceleration sensor, or a heat detection type acceleration sensor, for example. In addition, the present disclosure is not limited to a configuration in which each of the three acceleration sensors 18*x*, 18*y*, and 18*z* is used for on axis as long as a sensor that can measure acceleration along three axes is provided. For example, a sensor device that can measure acceleration along three axes with one device (package) may also be used.

The control IC 19 is a micro controller unit (MCU), a memory including a non-volatile storage or an A/D converter is built into the control IC 19, and the control IC 19 controls each part of the sensor unit 100. The memory stores a program in which the order in which acceleration is measured and contents are prescribed, a program that digitizes detection data and incorporates the detection data into packet data, accompanying data, or the like. Note that, in the circuit board 15, a plurality of electric components other than those described above are mounted although the electric components are not shown.

Configuration Example of Acceleration Sensor

Figure 7:
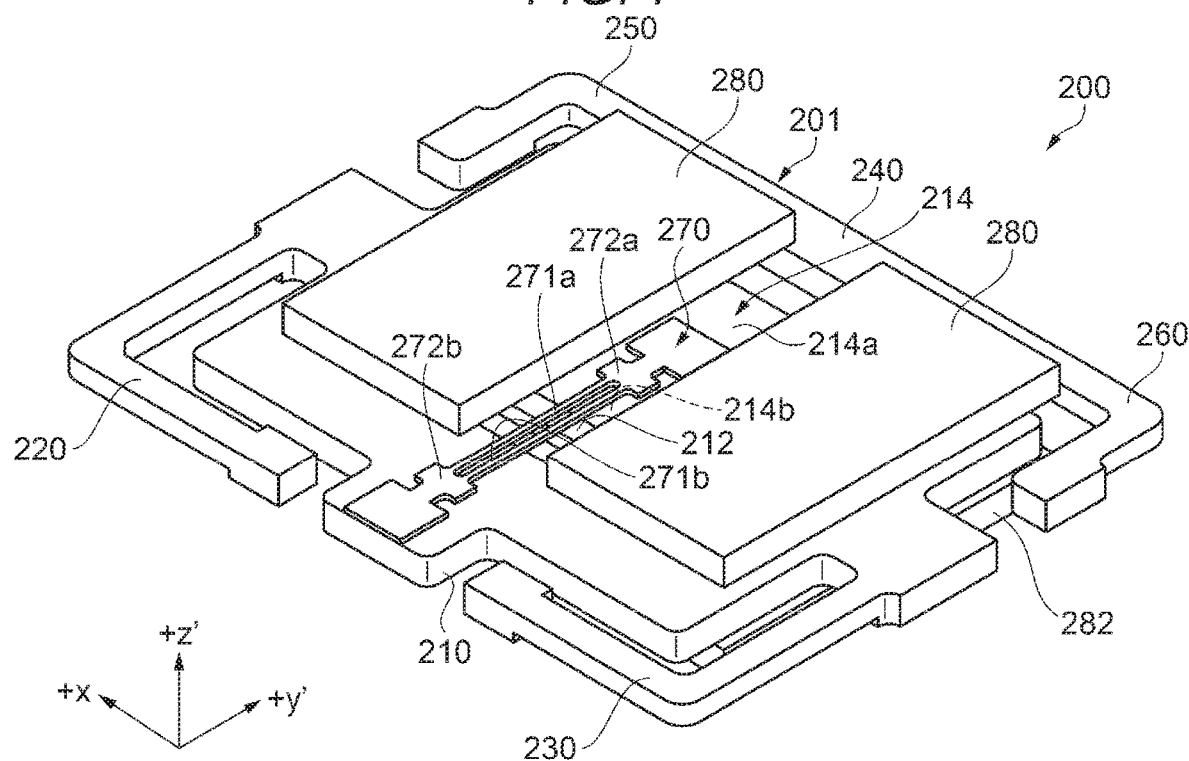
FIG. 7 is a perspective view for describing a schematic configuration of an acceleration sensor element.
Figure 8:
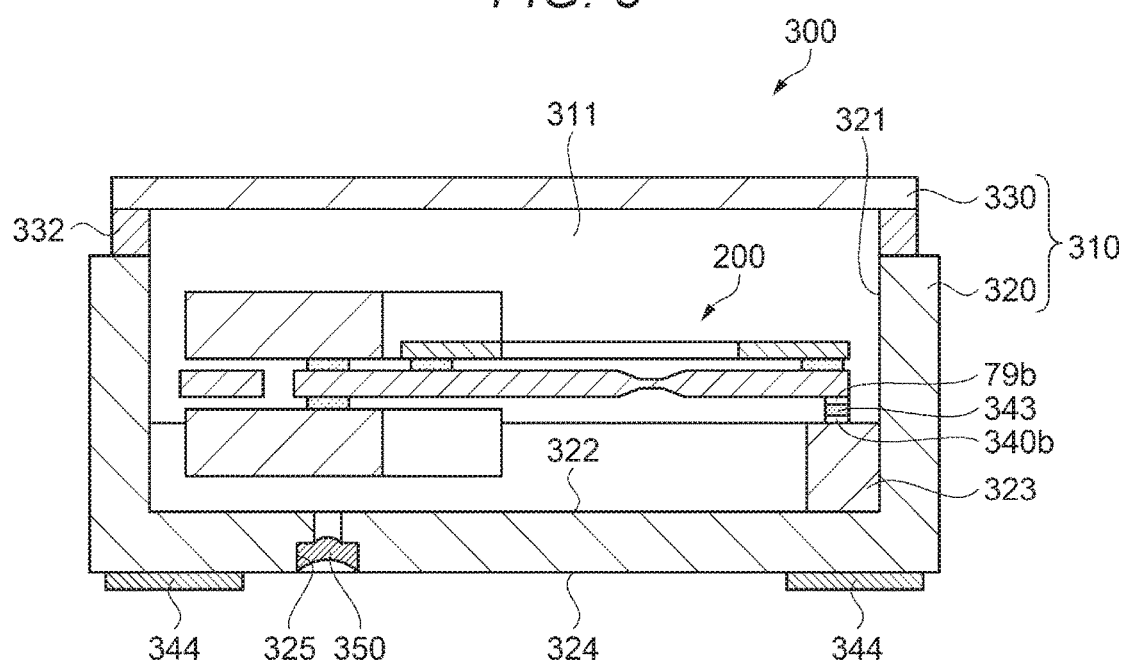
FIG. 8 is a front view (sectional view) for describing a schematic configuration of an acceleration measuring device which uses the acceleration sensor element.

Here, configurations of the acceleration sensors 18*x*, 18*y*, and 18*z* will be described with reference to FIGS. 7 and 8. FIG. 7 is a perspective view for describing a schematic configuration of an acceleration sensor element. FIG. 8 is a front view (sectional view) for describing a schematic configuration of an acceleration measuring device which uses the acceleration sensor element.

Note that, in FIG. 7, an x axis, a y' axis, and a z' axis are shown as three axes orthogonal to each other. Here, when an axis which is obtained by inclining a z axis by a rotation angle $\phi$ (preferably, $-5° \leq \phi \leq 15°$ with an x axis as a rotation axis such that a +z side is rotated in a −y direction along a y axis is the z' axis and an axis which is obtained by inclining the y axis by the rotation angle $\phi$ such that a +y side is rotated in a +z direction along the z axis is the y' axis in an orthogonal coordinate system consisting of the x axis as an electrical axis of a crystal, which is a piezoelectric material used as a base material of an acceleration sensor, the y axis as a mechanical axis, and the z axis as an optical axis, an example in which a so-called crystal z-plate (z'-plate), which is processed into a flat plate shape by being cut along a plane defined by the x axis and the y' axis and has a predetermined thickness t in a z' axis direction orthogonal to the plane, is used as a base material will be described. Note that, the z' axis is an axis along a direction in which the gravity acts in an acceleration measuring device 300.

Configuration of Acceleration Sensor Element

First, a configuration of an acceleration sensor element 200 will be described with reference to FIG. 7. The acceleration sensor element 200 is provided with a board structure 201 including a base portion 210 or the like, an acceleration measuring element 270 that is coupled to the board structure 201 and measures a physical quantity, and mass portions 280 and 282.

The board structure 201 of the acceleration sensor element 200 is provided with the base portion 210, a movable portion 214 connected to the base portion 210 via a joint portion 212, a connection portion 240, a first supporter 220, a second supporter 230, a third supporter 250, and a fourth supporter 260, the first supporter 220, the second supporter 230, the third supporter 250, and the fourth supporter 260 being connected to the base portion 210. Here the third supporter 250 and the fourth supporter 260 are connected to each other on a side on which the connection portion 240 is disposed.

For the board structure 201, a crystal board of a crystal z-plate (z'-plate) that is cut from a crystal ore (which is piezoelectric material) at a predetermined angle as described above is used. Through patterning of the crystal board, those described above are integrally formed with each other as the board structure 201. In addition, for the patterning, for example, a photolithography technique and a wet etching technique can be used.

The base portion 210 is coupled to the movable portion 214 via the joint portion 212 and supports the movable portion 214. The base portion 210 is coupled to the movable portion 214 via the joint portion 212, is coupled to the connection portion 240 that is positioned on a side opposite to a side on which the joint portion 212 of the movable portion is positioned, is coupled to the first supporter 220 and the second supporter 230, and is coupled to the third supporter 250 and the fourth supporter 260 connected to each other on the connection portion 240 side.

The joint portion 212 is provided between the base portion 210 and the movable portion 214 and is coupled to the base portion 210 and the movable portion 214. The thickness (length in z' axis direction) of the joint portion 212 is smaller than the thickness of the base portion 210 and the thickness of the movable portion 214 and has a narrow shape in a sectional view as seen in an x axis direction. The joint portion 212 can be formed by forming a thin portion having a small thickness can be formed by performing so-called half etching on the board structure 201 including the joint portion 212, for example. The joint portion 212 functions as a rotation axis along the x axis direction and as a fulcrum (intermediate hinge) when the movable portion 214 is displaced (pivots) with respect to the base portion 210.

The movable portion 214 is coupled to the base portion 210 via the joint portion 212. The movable portion 214 has a plate-like shape and is provided with main surfaces 214*a* and 214*b* which face each other in the z' axis direction and are opposite to each other. The movable portion 214 can be displaced in a direction (z' axis direction) intersecting the main surfaces 214*a* and 214*b* with the joint portion 212 as a fulcrum (rotation axis) in accordance with acceleration, which is a physical quantity applied in the direction (z' axis direction) intersecting the main surfaces 214*a* and 214*b*.

The connection portion 240 extends in the x axis direction from the base portion 210 on a +x direction side on which the third supporter 250 (which will be described later) is provided such that the movable portion 214 is surrounded by the connection portion 240 and is coupled to the base portion 210 on a −x direction side on which the fourth supporter 260 (which will be described later) is provided.

The first supporter 220 and the second supporter 230 are provided to be symmetrical with respect to the acceleration measuring element 270. In addition, similarly, the third supporter 250 and the fourth supporter 260 are provided to be symmetrical with respect to the acceleration measuring element 270. In addition, the board structure 201 has a function of being supported on a fixation target portion (package 310 of acceleration measuring device 300 which will be described later with reference to FIG. 8) at the first supporter 220, the second supporter 230, the third supporter 250, and the fourth supporter 260.

The acceleration measuring element 270 is provided to be coupled to the base portion 210 and the movable portion 214 of the board structure 201. In other words, the acceleration measuring element 270 is provided to straddle the base portion 210 and the movable portion 214 of the board structure 201. The acceleration measuring element 270 is provided with vibration beams 271a and 271b as vibration portions, a first base portion 272a, and a second base portion 272b. Regarding the acceleration measuring element 270 of which the first base portion 272a and the second base portion 272b are coupled to the base portion 210, when the movable portion 214 is displaced in accordance with a physical quantity, a stress is generated on the vibration beams 271a and 271b and information about a physical quantity generated on the vibration beams 271a and 271b is changed, for example. In other words, the vibration frequency (resonant frequency) of the vibration beams 271a and 271b is changed. Note that, in the present embodiment, the acceleration measuring element 270 is a dual tuning fork element (dual tuning fork vibration element) provided with the two vibration beams 271a and 271b, the first base portion 272a, and the second base portion 272b. Note that, the vibration beams 271a and 271b as vibration portions may be vibration arms, vibration beams, or columnar beams.

As with the board structure 201, a crystal board of a crystal z-plate (z'-plate) that is cut from a crystal ore (which is piezoelectric material) at a predetermined angle as described above is used, as with the board structure 201 for the acceleration measuring element 270. The acceleration measuring element 270 is formed by performing patterning on the crystal board by using a photolithography technique and an etching technique. Accordingly, the vibration beams 271a and 271b, the first base portion 272a, and the second base portion 272b can be integrally formed with each other.

The material of the acceleration measuring element 270 is not limited to the above-described crystal board. For example, a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), aluminum nitride (AlN), or the like may also be used. In addition, a semiconductor material such as silicon that is provided with a film of a piezoelectric substance (piezoelectric material) such as zinc oxide (ZnO) and aluminum nitride (AlN) may also be used. However, it is preferable that the same material as that of the board structure 201 is used.

The acceleration measuring element 270 is provided with, for example, an extraction electrode (not shown) or an excitation electrode. However, the description thereof will be omitted.

The mass portions 280 and 282 are provided on the main surface 214a of the movable portion 214 and the main surface 214b, which is opposite to the main surface 214a and is a rear surface. More specifically, the mass portions 280 and 282 are provided on the main surface 214a and the main surface 214b via a mass bonding material (not shown). Examples of the material of the mass portions 280 and 282 include metal such as copper (Cu) and gold (Au), for example.

In the present embodiment, regarding the acceleration measuring element 270, a configuration, in which a so-called dual tuning fork vibrator of which a vibration portion is configured of two columnar beams (vibration beams 271a and 271b) is used, has been used as an example. However, the acceleration measuring element 270 may be configured of one columnar beam (single beam).

Configuration of Acceleration Detector

Next, a configuration of the acceleration measuring device 300 which uses the above-described acceleration sensor element 200 will be described with reference to FIG. 8. Note that, the acceleration measuring device 300 described herein can be used as the acceleration sensors 18x, 18y, and 18z of the sensor unit 100.

As illustrated in FIG. 8, the above-described acceleration sensor element 200 is installed (accommodated) in the acceleration measuring device 300. The acceleration measuring device 300 is provided with the acceleration sensor element 200 and the package 310. In addition, the package 310 is provided with a package base 320 and a lid 330. In the acceleration measuring device 300, the acceleration sensor element 200 is accommodated (installed) in the package 310. More specifically, the acceleration sensor element 200 is accommodated (installed) in a space 311 which is provided with the package base 320 and the lid 330 coupled to each other.

The package base 320 is provided with a recess 321 and the acceleration sensor element 200 is provided in the recess 321. The shape of the package base 320 is not particularly limited as long as the acceleration sensor element 200 can be provided in the recess 321. For the package base 320 in the present embodiment, for example, a ceramic is used. However, the present disclosure is not limited thereto and a material such as a crystal, glass, silicon, or the like can be used.

The package base 320 is provided with a stepped portion 323 that protrudes toward the lid 330 side from an inner bottom surface (bottom surface inside recess) 322 of the package base 320. The stepped portion 323 is provided along an inner wall of the recess 321, for example. The stepped portion 323 is provided with a plurality of internal terminals 340b.

The internal terminals 340b are provided to face fixation portion coupling terminals 79b, which are provided for fixation portions of the first supporter 220, the second supporter 230, the third supporter 250, and the fourth supporter 260 of the acceleration sensor element 200 (provided to overlap fixation portion coupling terminals 79b in plan view). The internal terminals 340b are electrically coupled to the fixation portion coupling terminals 79b via a silicon resin-based conductive adhesive 343 including a conductive material such as a metal filler. As described above, the acceleration sensor element 200 is mounted on the package base 320 and is accommodated in the package 310.

An outer bottom surface 324 (surface opposite to inner bottom surface 322) of the package base 320 is provided with external terminals 344 that is used when the package base 320 is mounted on an external member. The external terminals 344 are electrically coupled to the internal terminals 340b via an internal wire (not shown).

Each of the internal terminals 340b and the external terminals 344 consists of metal layers obtained by stacking a film of nickel (Ni) or gold (Au) on a metallized layer of tungsten (W) or the like through metal plating.

A bottom portion of the recess 321 of the package base 320 is provided with a sealer 350 that seals the internal space (cavity) of the package 310. The sealer 350 is provided in a through-hole 325 formed in the package base 320. The through-hole 325 penetrates from the outer bottom surface 324 to the inner bottom surface 322. In an example shown in FIG. 8, the through-hole 325 has a stepped shape of which the hole diameter on the outer bottom surface 324 side is larger than the hole diameter on the inner bottom surface 322 side. The sealer 350 is provided by disposing a sealing member formed of an alloy of gold (Au) and germanium (Ge), solder, or the like in the through-hole 325 and solidifying the sealing member after heating and melting the sealing member. The sealer 350 is provided in order to air-tightly seal the internal space of the package 310.

The lid 330 is provided to cover the recess 321 of the package base 320. The shape of the lid 330 is, for example, a plate-like shape. For the lid 330, for example, the same material as that of the package base 320, an alloy of iron (Fe) and nickel (Ni), and metal such as stainless steel can be used. The lid 330 is bonded to the package base 320 via a lid bonding member 332. As the lid bonding member 332, for example, a seam ring, low melting point glass, an inorganic adhesive, or the like can be used.

It is possible to air-tightly seal the internal space of the package 310 by providing the sealer 350 obtained by disposing the sealing member in the through-hole 325 in a state where the pressure in the package 310 is decreased after the lid 330 is bonded to the package base 320 (state where degree of vacuum is high), heating and melting the sealing member, and solidifying the sealing member. The internal space of the package 310 may be filled with inert gas such as nitrogen, helium, and argon.

When a drive signal is applied to the excitation electrode of the acceleration sensor element 200 in the acceleration measuring device 300 via the external terminals 344, the internal terminals 340*b*, and the fixation portion coupling terminals 79*b*, the vibration beams 271*a* and 271*b* of the acceleration sensor element 200 vibrate (resonate) at a predetermined frequency. In addition, the acceleration measuring device 300 can output the resonant frequency of the acceleration sensor element 200, which changes in accordance with applied acceleration, as an output signal.

According to the above-described sensor unit 100, the circuit board 15 is fixed to the container 1 (second pedestals 25 and 26) via the fixation member 30 at a region in the second region AL2 that is on the coupling region AL3 side. Therefore, a stress generated on the first region AL1 side can be released due to bending of the coupling region AL3 having the sectional area S3. Specifically, since the constriction portions 33 and 34 are provided, the sectional area S3 of the coupling region AL3 is smaller than the sectional area S1 of the first region AL1 in which the connecter 16 is mounted and the sectional area S2 of the second region AL2 in which the acceleration sensors 18*x*, 18*y*, and 18*z* are mounted. In addition, the circuit board 15 is attached to the second pedestals 25 and 26 of the container 1 via the fixation members 30 at a region in the second region AL2 that is on the coupling region AL3 side. Therefore, a stress attributable to bending or the like of the circuit board 15 that is caused by plugging and unplugging (attachment and detachment) between the plug-type (male) connecter 16 mounted in the first region AL1 and the socket-type (female) connecter (not shown) is released due to bending of the coupling region AL3 of which the sectional area is small and which is likely to be bent and thus transmission of the stress to the second region AL2 side, on which the acceleration sensors 18*x*, 18*y*, and 18*z* are mounted, can be suppressed. Accordingly, it is possible to realize the sensor unit 100 in which influence on detection accuracy, which is generated when a stress caused by plugging and unplugging (attachment and detachment) between the plug-type (male) connecter 16 and the socket-type (female) connecter (not shown) or disposition of the connecter 16 is transmitted to the acceleration sensors 18*x*, 18*y*, and 18*z*, is suppressed.

Regarding the sensor unit 100 provided with the circuit board 15 configured as described above, a change in output of the sensor unit 100 at the time of plugging and unplugging (attachment and detachment) between the plug-type (male) connecter 16 and the socket-type (female) connecter (not shown) will be specifically described with reference to graphs in FIGS. 9A and 9B. FIG. 9A is a graph illustrating the state of output of an acceleration sensor at the time of attachment and detachment of a connecter. FIG. 9B is a graph illustrating a change in output of the acceleration sensor caused by attachment and detachment of the connecter. Note that, in FIGS. 9A and 9B, a change in output of the sensor unit 100 at the time of plugging and unplugging (attachment and detachment) between the plug-type (male) connecter 16 and the socket-type (female) connecter (not shown) in a configuration in which the circuit board 15 is not attached to the second pedestals 25 and 26 is also shown as a comparative example.

The results of five times of output measurement performed before attachment and detachment of the connecter and the results of ten times of output measurement performed after attachment and detachment of the connecter are plotted in the graph of FIG. 9A. Before the attachment and detachment of the connecter, there is substantially no change in output for both of a configuration according to the comparative example in which the second region AL2 of the circuit board 15 is not fixed and a configuration according to the present embodiment in which the second region AL2 of the circuit board 15 is fixed. However, in the case of the comparative example, the result of the fifth measurement indicates a slightly great change as a singular point. Regarding the results of ten times of measurement performed after attachment and detachment of the connecter after the five times of measurement, there is substantially no change in output measurement result in the configuration according to the present embodiment in which the second region AL2 of the circuit board 15 is fixed. In contrast, in the case of the configuration according to the comparative example in which the second region AL2 of the circuit board 15 is not fixed, the output significantly jumps at the time of the first measurement after the attachment and detachment of the connecter and the increased output is maintained throughout the subsequent nine times of measurement. That is, it can be understood that a stress caused by attachment and detachment of a connecter influences the output of the sensor unit 100 and there is a change in output in the case of the configuration according to the comparative example in which the second region AL2 of the circuit board 15 is not fixed.

In addition, the graph in FIG. 9B illustrates the amount of change in output after plugging and unplugging (attachment and detachment) between the plug-type (male) connecter 16 and the socket-type (female) connecter (not shown) related to a case where the circuit board 15 according to the present embodiment is attached to the second pedestals 25 and 26 (present embodiment) and the amount of change in output after plugging and unplugging (attachment and detachment) between the plug-type (male) connecter 16 and the socket-type (female) connecter (not shown) related to a case where the circuit board 15 according to the present embodiment is not attached to the second pedestals 25 and 26 (comparative example). It can be understood from the graph in FIG. 9B that the output is greatly changed after plugging and unplugging (attachment and detachment) between the plug-type (male) connecter 16 and the socket-type (female) connecter (not shown) when the circuit board 15 according to the present embodiment is not attached to the second pedestals 25 and 26 (comparative example).

As described above, in the case of the configuration according to the present embodiment in which the second region AL2 of the circuit board 15 is fixed, there is substantially no change in output after plugging and unplugging (attachment and detachment) between the plug-type (male) connecter 16 and the socket-type (female) connecter (not shown). That is, in the case of the configuration according to the present embodiment in which the second region AL2 of the circuit board is fixed, influence on detection accuracy, which is generated when a stress caused by plugging and unplugging (attachment and detachment) between the plug-type (male) connecter 16 and the socket-type (female) connecter (not shown) is transmitted to the acceleration sensors 18x, 18y, and 18z, can be suppressed.

Modification Example of Circuit Board Configuration

Note that, with regard to the shape (configuration) of the coupling region AL3 of the circuit board 15, various shapes for reduction in sectional area S3 can be applied. Hereinafter, a modification example of the coupling region AL3 of the circuit board 15 will be sequentially described with reference to FIGS. 10, 11, 12, 13A, and 13B.

Modification Example 1

First, Modification Example 1 of the shape of the coupling region AL3 of the circuit board 15 will be described with reference to FIG. 10. FIG. 10 is an external appearance perspective view illustrating Modification Example 1 of the shape of the board (circuit board).

As illustrated in FIG. 10, a central portion of the coupling region AL3 of a circuit board 15b according to Modification Example 1 in the first direction (X axis direction) along the longer side of the container 1, which is a direction in which the first region AL1 and the second region AL2 are arranged is provided with an constriction portion 34b at which the outer edge of one longer side of the circuit board 15b is constricted in a plan view as seen in the Z axis direction. The constriction portion 34b is constricted from the outer edge of the circuit board 15b that is on one side of the circuit board 15b in the second direction (Y axis direction) orthogonal to the first direction toward the center of the circuit board 15b in a plan view. Since the constriction portion 34b is provided, the sectional area S3 of a section of the coupling region AL3 of the circuit board 15b which is parallel to the second direction (Y axis direction) orthogonal to the first direction is smaller than the sectional area S1 of a section as described above of the first region AL1 and the sectional area S2 of a section as described above of the second region AL2, as seen in the first direction (X axis direction).

According to the circuit board 15b in Modification Example 1, since the coupling region AL3 is provided with the constriction portion 34b, bending of the coupling region AL3 is likely to occur when a stress is generated on the circuit board 15b due to plugging and unplugging (attachment and detachment) between a plug-type (male) connecter (not shown) attached to the first region AL1 and a socket-type (female) connecter (not shown) and thus it is possible to improve an effect of releasing a stress in the coupling region AL3.

Modification Example 2

Figure 11:
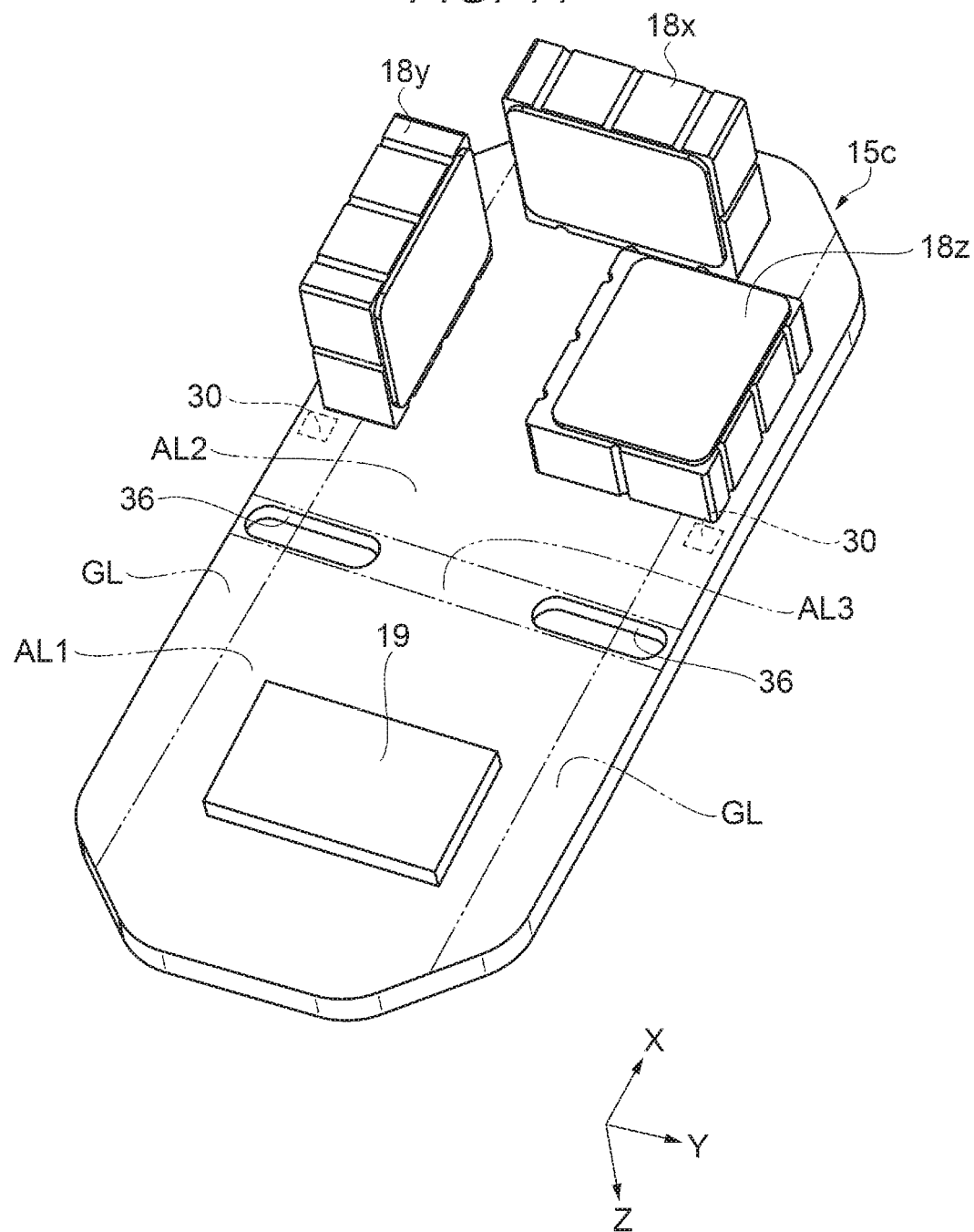
FIG. 11 is an external appearance perspective view illustrating Modification Example 2 of the shape of the board (circuit board).

Next, Modification Example 2 of the shape of the coupling region AL3 of the circuit board 15 will be described with reference to FIG. 11. FIG. 11 is an external appearance perspective view illustrating Modification Example 2 of the shape of the board (circuit board).

As illustrated in FIG. 11, in the coupling region AL3 of a circuit board 15c according to Modification Example 2, two elongated hole-shaped through-holes 36 are disposed in outer edge regions GL on opposite longer sides of the circuit board 15c, which extend in the first direction (X axis direction) in which the first region AL1 and the second region AL2 are arranged, in a plan view as seen in the Z axis direction. The through-hole 36 is provided on each of the opposite sides of the circuit board 15c in the second direction (Y axis direction) orthogonal to the first direction, as seen in a plan view. Since the elongated hole-shaped through-holes 36 are provided, the sectional area S3 of a section of the coupling region AL3 of the circuit board 15c which is parallel to the second direction (Y axis direction) orthogonal to the first direction is smaller than the sectional area S1 of a section as described above of the first region AL1 and the sectional area S2 of a section as described above of the second region AL2, as seen in the first direction (X axis direction). Note that, the outer edge regions GL herein include opposite outer edges extending along the longer sides of the circuit board 15c and refer to regions positioned inward of the outer edges except for the central portion of the circuit board 15c.

According to the circuit board 15c in Modification Example 2, since the elongated hole-shaped through-holes 36 are provided in the coupling region AL3, bending of the coupling region AL3 is likely to occur when a stress is generated on the circuit board 15c due to plugging and unplugging (attachment and detachment) between a plug-type (male) connecter (not shown) attached to the first region AL1 and a socket-type (female) connecter (not shown) and thus it is possible to improve an effect of releasing a stress in the coupling region AL3. In addition, since the elongated hole-shaped through-holes 36 are provided on the opposite sides of the circuit board 15c in the second direction, bending of the coupling region AL3 is likely to occur in a good balance and thus it is possible to further improve an effect of releasing a stress in the coupling region AL3.

Note that, in Modification Example 2, a configuration in which the elongated hole-shaped through-hole 36 in the coupling region AL3 is provided on each of the opposite sides of the circuit board 15c in the second direction has been described. However, the number of the elongated hole-shaped through-holes 36 is not limited thereto and may be any number. In addition, in the coupling region AL3, the elongated hole-shaped through-holes 36 may be provided in the central portion of the circuit board 15c in the second direction.

Modification Example 3

Figure 12:
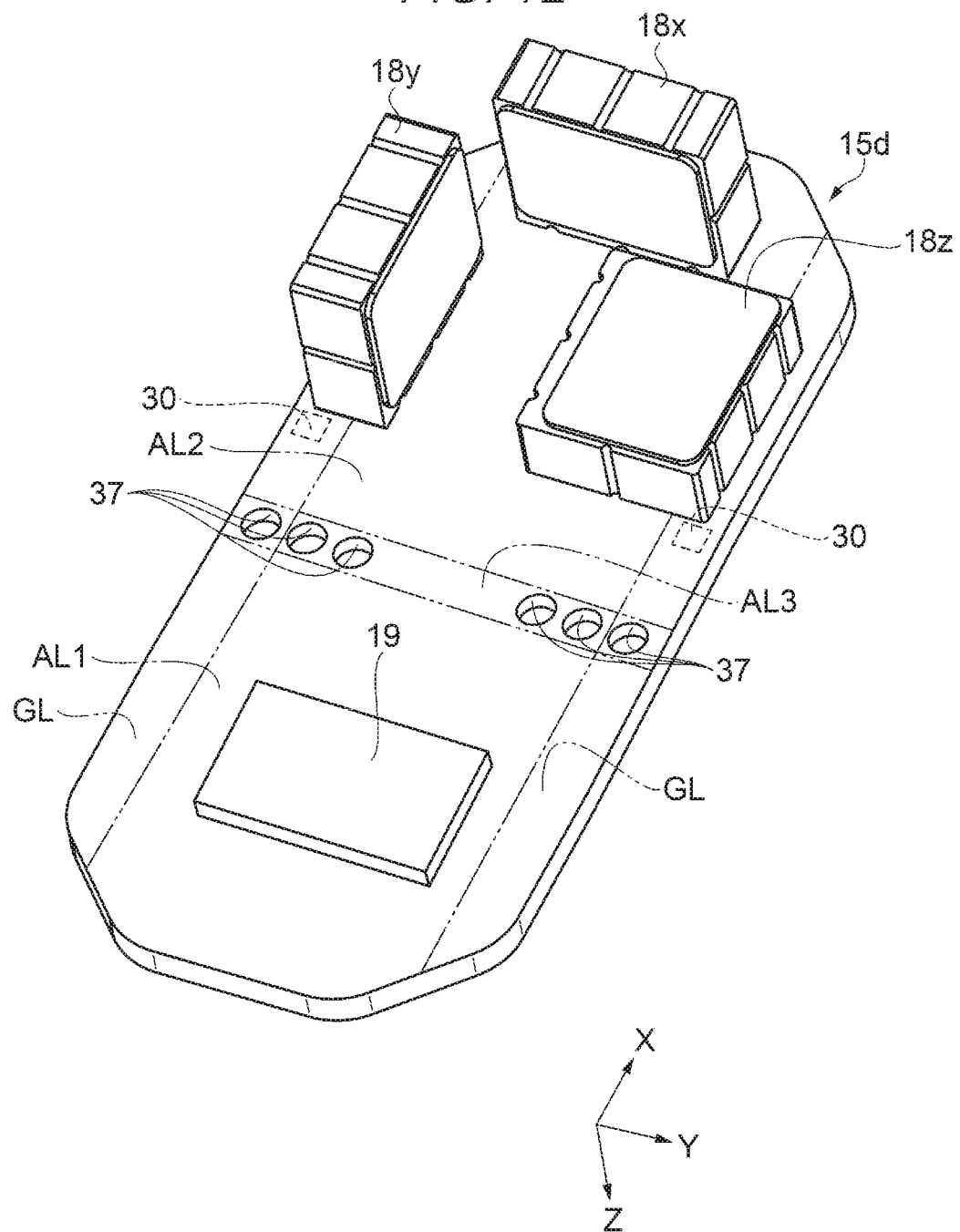
FIG. 12 is an external appearance perspective view illustrating Modification Example 3 of the shape of the board (circuit board).

Next, Modification Example 3 of the shape of the coupling region AL3 of the circuit board 15 will be described with reference to FIG. 12. FIG. 12 is an external appearance perspective view illustrating Modification Example 3 of the shape of the board (circuit board).

As illustrated in FIG. 12, in the coupling region AL3 of a circuit board 15d according to Modification Example 3, six circular hole-shaped through-holes 37 are disposed in the outer edge regions GL on opposite longer sides of the circuit board 15*d*, which extend in the first direction (X axis direction) in which the first region AL1 and the second region AL2 are arranged, in a plan view as seen in the Z axis direction. Three through-holes 37 are arranged on each of the opposite sides of the circuit board 15*d* in the second direction (Y axis direction) orthogonal to the first direction, as seen in a plan view. Since the circular hole-shaped through-holes 37 are provided, the sectional area S3 of a section of the coupling region AL3 of the circuit board 15*d* which is parallel to the second direction (Y axis direction) orthogonal to the first direction is smaller than the sectional area S1 of a section as described above of the first region AL1 and the sectional area S2 of a section as described above of the second region AL2, as seen in the first direction (X axis direction). Note that, the outer edge regions GL herein include opposite outer edges extending along the longer sides of the circuit board 15*d* and refer to regions positioned inward of the outer edges except for the central portion of the circuit board 15*d*.

According to the circuit board 15*d* in Modification Example 3, since the circular hole-shaped through-holes 37 are provided in the coupling region AL3, bending of the coupling region AL3 is likely to occur when a stress is generated on the circuit board 15*d* due to plugging and unplugging (attachment and detachment) between a plug-type (male) connecter (not shown) attached to the first region AL1 and a socket-type (female) connecter (not shown) and thus it is possible to improve an effect of releasing a stress in the coupling region AL3. In addition, since the circular hole-shaped through-holes 37 are arranged in a direction from the outer edge to the central portion on the opposite sides of the circuit board 15*d* in the second direction, bending of the coupling region AL3 is likely to occur in a good balance and thus it is possible to further improve an effect of releasing a stress in the coupling region AL3.

Note that, in Modification Example 3, a configuration in which three circular hole-shaped through-hole 37 in the coupling region AL3 are arranged in a direction from the outer edge to the central portion on each of the opposite sides of the circuit board 15*c* in the second direction has been described. However, the number of the circular hole-shaped through-holes 37 is not limited thereto and may be any number. In addition, in the coupling region AL3, the circular hole-shaped through-holes 37 may be provided in the central portion of the circuit board 15*d* in the second direction. That is, in the coupling region AL3, the circular hole-shaped through-holes 37 may be arranged from one outer edge side of the circuit board 15*d* in the second direction to the other outer edge side. In addition, in the coupling region AL3, an appropriate combination of the elongated hole-shaped through-holes 36 in Modification Example 2 and the circular hole-shaped through-holes 37 in Modification Example 3 may be disposed.

Modification Example 4

Figure 13A:
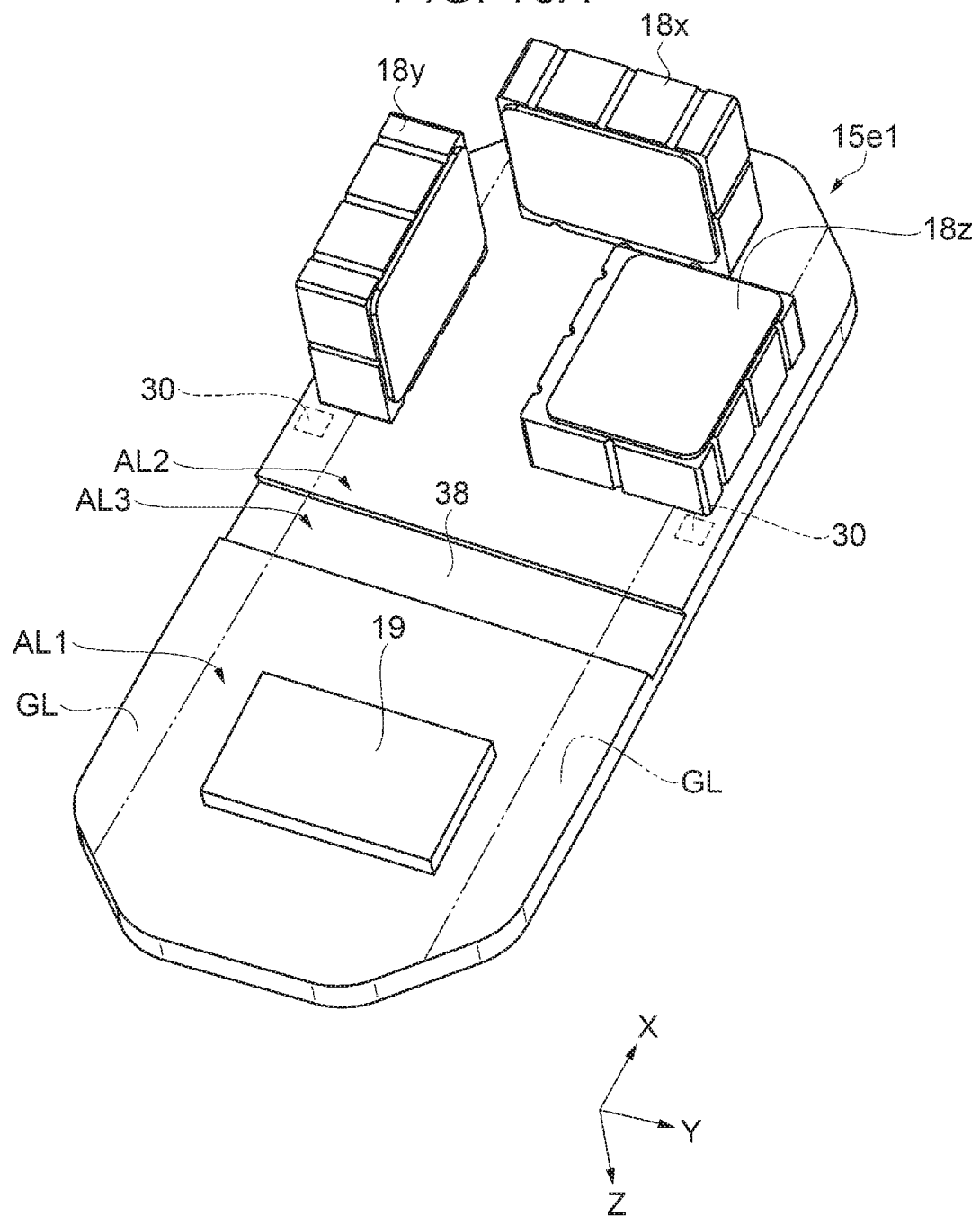
FIG. 13A is an external appearance perspective view illustrating Modification Example 4 of the shape of the board (circuit board).

Next, Modification Example 4 of the shape of the coupling region AL3 of the circuit board 15 will be described with reference to FIG. 13A. FIG. 13A is an external appearance perspective view illustrating Modification Example 4 of the shape of the board (circuit board).

As illustrated in FIG. 13A, the coupling region AL3 of a circuit board 15*e*1 according to Modification Example 4 is a thin portion 38 at which the thickness of the outer edge regions GL on opposite longer sides of the circuit board 15*e*1, which extend in the first direction (X axis direction) in which the first region AL1 and the second region AL2 are arranged, is smaller than that of other regions in a plan view as seen in the Z axis direction. The thin portion 38 of Modification Example 4 includes the outer edge regions GL on the opposite longer sides of the circuit board 15*e*1 and is provided over an area from one outer edge of the circuit board 15*e*1 in the second direction to the other outer edge. Since the thin portion 38 is provided, the sectional area S3 of a section of the coupling region AL3 of the circuit board 15*e*1 which is parallel to the second direction (Y axis direction) orthogonal to the first direction is smaller than the sectional area S1 of a section as described above of the first region AL1 and the sectional area S2 of a section as described above of the second region AL2, as seen in the first direction (X axis direction). Note that, the outer edge regions GL herein include opposite outer edges extending along the longer sides of the circuit board 15*e*1 and refer to regions positioned inward of the outer edges except for the central portion of the circuit board 15*e*1.

According to the circuit board 15*e*1 in Modification Example 4, since the thin portion 38 is provided in the coupling region AL3, bending of the coupling region AL3 is likely to occur when a stress is generated on the circuit board 15*e*1 due to plugging and unplugging (attachment and detachment) between a plug-type (male) connecter (not shown) attached to the first region AL1 and a socket-type (female) connecter (not shown) and thus it is possible to improve an effect of releasing a stress in the coupling region AL3.

Modification Example 5

Figure 13B:
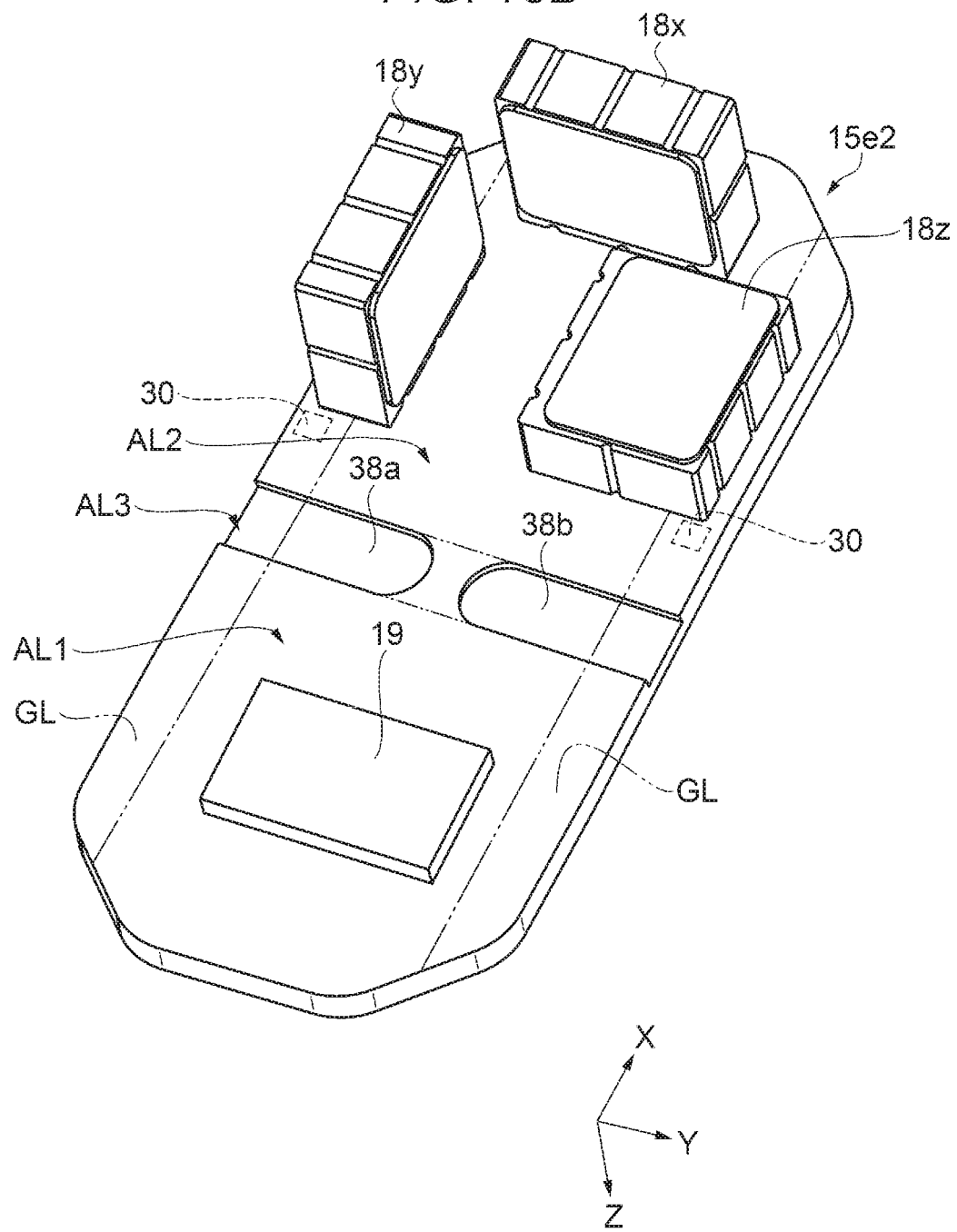
FIG. 13B is an external appearance perspective view illustrating Modification Example 5 of the shape of the board (circuit board).

Next, Modification Example 5 of the shape of the coupling region AL3 of the circuit board 15 will be described with reference to FIG. 13B. FIG. 13B is an external appearance perspective view illustrating Modification Example 5 of the shape of the board (circuit board).

As illustrated in FIG. 13B, in the coupling region AL3 of a circuit board 15*e*2 according to Modification Example 5, thin portions 38*a* and 38*b* of which the thickness is smaller than that of other regions are provided in the outer edge regions GL on opposite longer sides of the circuit board 15*e*2, which extend in the first direction (X axis direction) in which the first region AL1 and the second region AL2 are arranged, in a plan view as seen in the Z axis direction. The thin portions 38*a* and 38*b* are provided close to outer edges of the circuit board 15*e*2 positioned on opposite sides in the second direction (Y axis direction) orthogonal to the first direction such that the thin portions 38*a* and 38*b* extend from the outer edges to the center. Since the thin portions 38*a* and 38*b* are provided, the sectional area S3 of a section of the coupling region AL3 of the circuit board 15*e*2 which is parallel to the second direction (Y axis direction) orthogonal to the first direction is smaller than the sectional area S1 of a section as described above of the first region AL1 and the sectional area S2 of a section as described above of the second region AL2, as seen in the first direction (X axis direction). Note that, the outer edge regions GL herein include opposite outer edges extending along the longer sides of the circuit board 15*e*2 and refer to regions positioned inward of the outer edges except for the central portion of the circuit board 15*e*2.

According to the circuit board 15*e*2 in Modification Example 5, since the thin portions 38*a* and 38*b* in the coupling region AL3 such that the thin portions are provided on opposite sides of the circuit board 15*e*2 in the second direction, bending of the coupling region AL3 is likely to occur in a good balance when a stress is generated on the circuit board 15e2 due to plugging and unplugging (attachment and detachment) between a plug-type (male) connecter (not shown) attached to the first region AL1 and a socket-type (female) connecter (not shown) and thus it is possible to improve an effect of releasing a stress in the coupling region AL3.

Modification Example of Attachment of Circuit Board to Container

Figure 14:
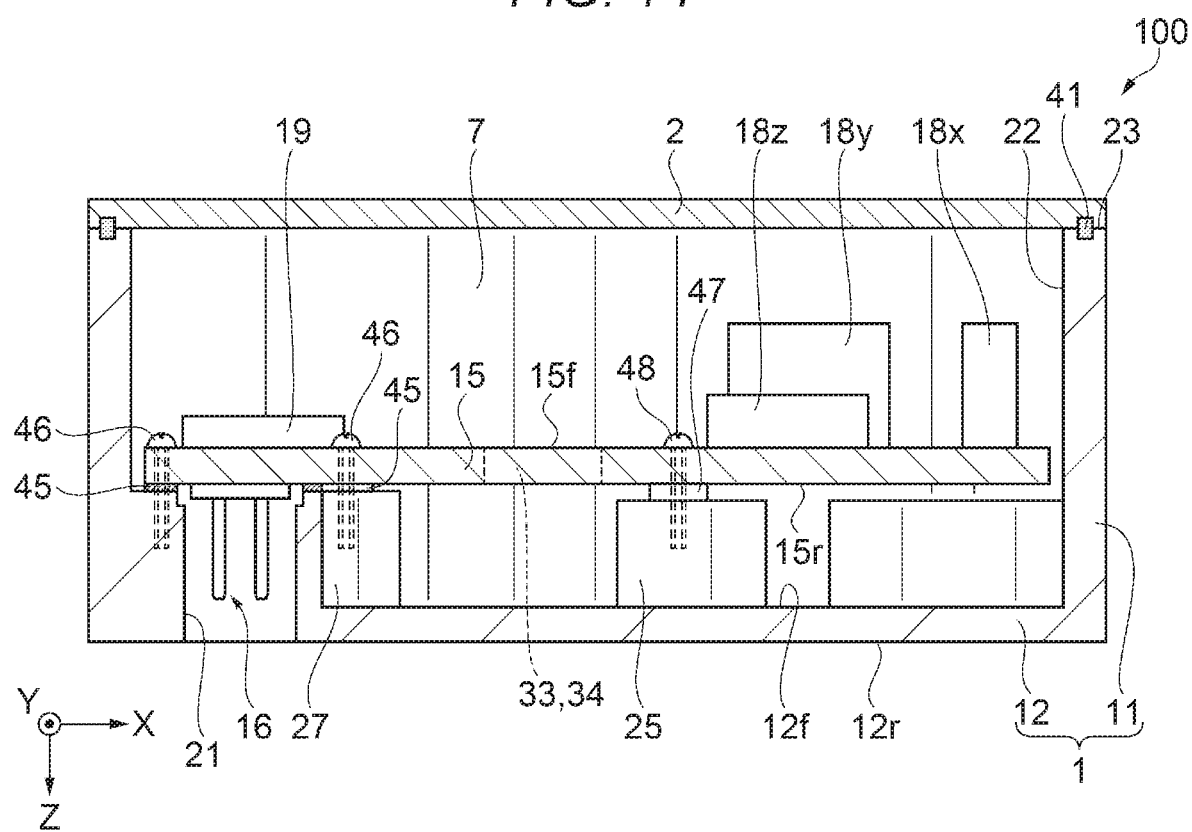
FIG. 14 is a front view (sectional view) illustrating a modification example of attachment of the board (circuit board) to the container.

Here, a modification example of a structure for attaching the circuit board 15 to the container 1 will be described with reference to FIG. 14. FIG. 14 is a front view (sectional view) illustrating a modification example of attachment of the board (circuit board) to the container. Note that, the same components as in the above-described embodiment are given the same reference numerals and description thereof will be omitted.

According to the modification example of the structure for attaching the circuit board 15 to the container 1, as illustrated in FIG. 14, the circuit board 15 inserted into the internal space of the container 1 with the second surface 15r facing the first pedestal 27 and the second pedestals 25 and 26 is fixed to the first pedestal 27 by means of screws 46 via a fixation member 45 that is disposed in a ring shape in the vicinity of the plug-type (male) connecter 16 attached to the first pedestal 27. In addition, the circuit board 15 is attached to the second pedestals 25 and 26 by means of screws 48 via a fixation member 47. That is, the circuit board 15 is fixed to the first pedestal 27 of the container 1 by means of the screws 46 via the fixation member 45 in the vicinity of the plug-type (male) connecter 16 in the first region AL1 and is fixed to the second pedestals 25 and 26 by means of the screws 48 via the fixation member 47 at a region in the second region AL2 that is on the coupling region AL3 side.

When such a structure for attaching the circuit board 15 to the container 1 is applied, it is possible to reliably fix the circuit board 15 to the container 1 and to easily attach and detach the circuit board 15 to and from the container 1.

Note that, the fixation members 45 and 47 are preferably formed of a member having a smaller elastic modulus than that of the container 1. When the fixation members 45 and 47 are formed of a member having a smaller elastic modulus than that of the container 1, it is possible to cause the fixation members 45 and 47 to function vibration proof members and thus an impact or vibration transmitted to the circuit board 15 as noise vibration after being applied to the container 1 can be suppressed.

Application Examples of Circuit Board Configuration

Figure 15:
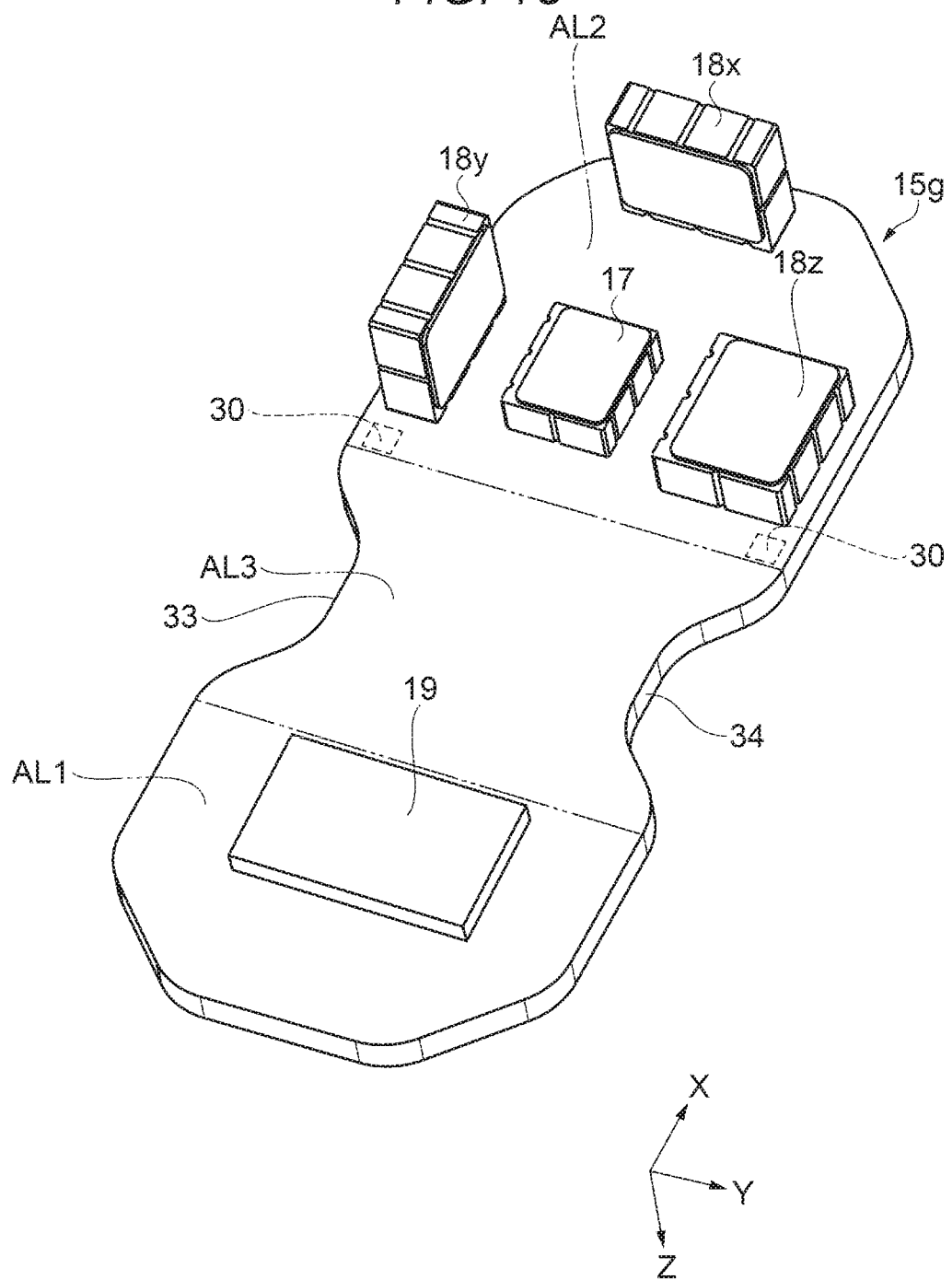
FIG. 15 is an external appearance perspective view illustrating Application Example 1 of the configuration of the board (circuit board).
Figure 16:
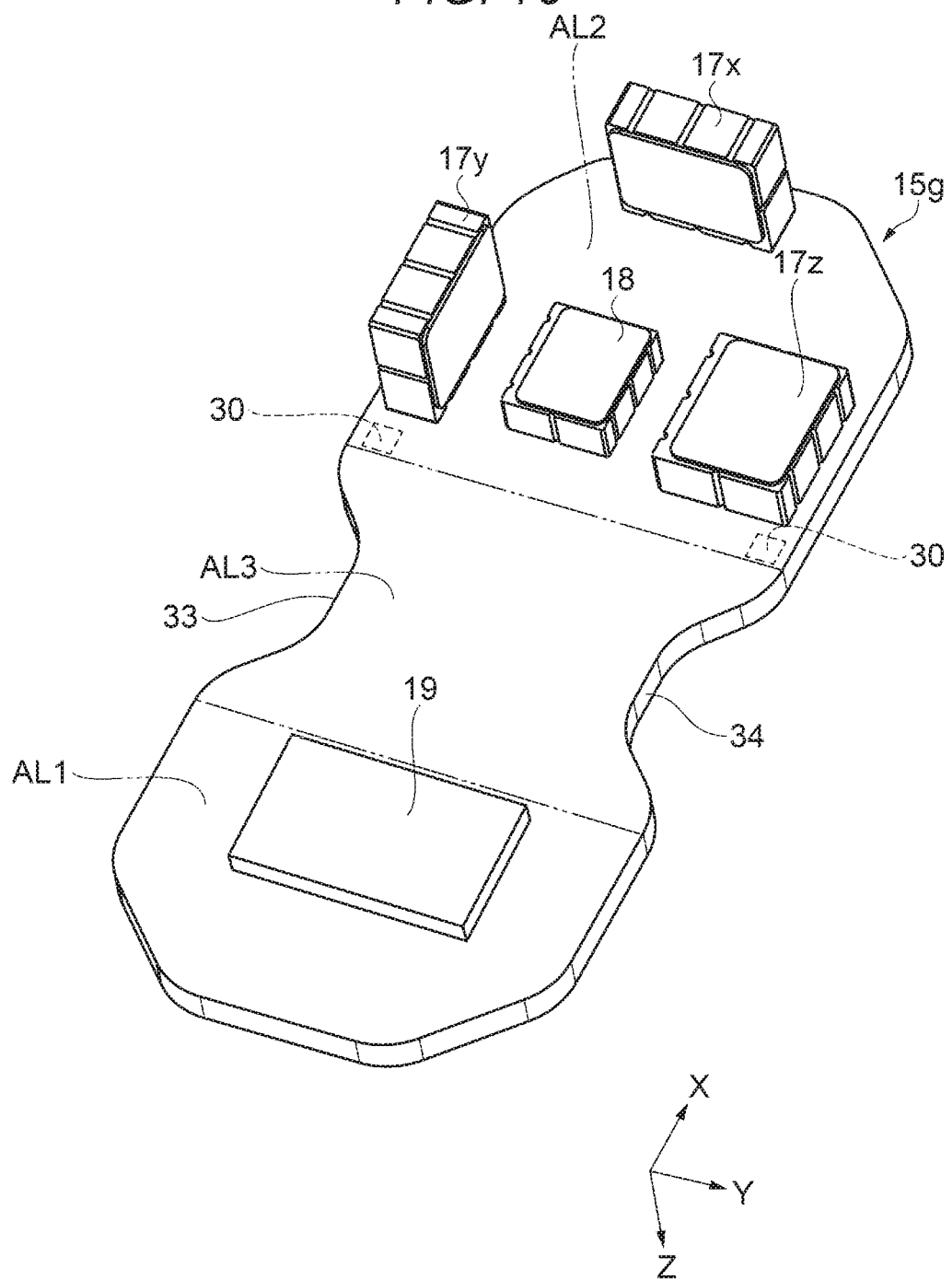
FIG. 16 is an external appearance perspective view illustrating Application Example 2 of the configuration of the board (circuit board).

The physical quantity sensors installed in the circuit board 15 may have a configuration different from that in the above-described embodiment. Hereinafter, Application Example 1 and Application Example 2 of the configuration of the circuit board 15 (configuration of installed member) will be sequentially described with reference to FIGS. 15 and 16. FIG. 15 is an external appearance perspective view illustrating Application Example 1 of the configuration of the board (circuit board). FIG. 16 is an external appearance perspective view illustrating Application Example 2 of the configuration of the board (circuit board). Note that, the same components as in the above-described embodiment are given the same reference numerals and description thereof will be omitted.

Application Example 1

First, Application Example 1 of the configuration of the physical quantity sensors installed in the circuit board 15 will be described with reference to FIG. 15. As illustrated in FIG. 15, as physical quantity sensors, the three acceleration sensors 18x, 18y, and 18z each of which can measure acceleration in one axis direction and an angular velocity sensor 17 that can measure angular velocity in three axis directions are mounted on a first surface of the second region AL2 of a circuit board 15g according to Application Example 1. The angular velocity sensor 17 can measure acceleration in three directions (three axes) along the X axis, the Y axis, and Z axis with one device and a vibration gyro sensor, which is obtained by processing a silicon board by using the MEMS technology, is used as the angular velocity sensor 17 in order to measure angular velocity from the Coriolis force applied to a vibrating object. Furthermore, a plug-type (male) connecter (not shown) is mounted on a second surface which is opposite to a first surface of the first region AL1 of the circuit board 15g and the control IC 19 is mounted on the first surface of the first region AL1 of the circuit board 15g.

A sensor unit which uses the circuit board 15g according to Application Example 1 can be used as an inertial measurement unit (IMU) which measures the posture or the behavior (inertia momentum) of a moving object (mounting target device) such as an automobile, an agricultural machine, a construction machine, a robot, and a drone. In addition, the sensor unit which uses the circuit board 15g functions as a so-called six-axis motion sensor which is provided with the acceleration sensors 18x, 18y, and 18z for three axes and the angular velocity sensor 17 for three axes, as the physical quantity sensors.

Application Example 2

Next, Application Example 2 of the configuration of the physical quantity sensors installed in the circuit board 15 will be described with reference to FIG. 16. As illustrated in FIG. 16, as physical quantity sensors, three angular velocity sensor 17x, 17y, and 17z each of which can measure angular velocity in one axis direction and an acceleration sensor 18 are mounted on a first surface of the second region AL2 of a circuit board 15h according to Application Example 2. Furthermore, a plug-type (male) connecter (not shown) is mounted on a second surface which is opposite to a first surface of the first region AL1 of the circuit board 15h and the control IC 19 is mounted on the first surface of the first region AL1 of the circuit board 15h.

Each of the angular velocity sensor 17x, 17y, and 17z is a gyro sensor that measures angular velocity along one axis. Preferably, a vibration gyro sensor which uses a crystal as a vibrator and measures angular velocity from the Coriolis force applied to a vibrating object is used. Note that, the gyro sensor is not limited to the vibration gyro sensor as long as a sensor that can measure angular velocity is provided. For example, a sensor in which a ceramic or silicon is used as a vibrator may also be used.

As the acceleration sensor 18, for example, a capacitance type acceleration sensor, which can measure acceleration in three directions (three axes) along the X axis, the Y axis, and Z axis with one device and which is obtained by processing a silicon board by using the MEMS technology, is used. Note that, the acceleration sensor is not limited to such a sensor as long as a sensor that can measure acceleration is provided. For example, a piezo-resistance type acceleration sensor or a heat detection type acceleration sensor may also be used. Alternatively, a configuration, in which one acceleration sensor is provided for each axis as with the above-described angular velocity sensors, may also be adopted.

A sensor unit which uses the circuit board 15*h* according to Application Example 2 can be used as an inertial measurement unit (IMU) which measures the posture or the behavior (inertia momentum) of a moving object (mounting target device) such as an automobile, an agricultural machine, a construction machine, a robot, and a drone. In addition, the sensor unit which uses the circuit board 15*h* functions as a so-called six-axis motion sensor which is provided with the acceleration sensor 18 for three axes and the angular velocity sensors 17*x*, 17*y*, and 17*z* for three axes, as the physical quantity sensors.

As described above, at least any of the acceleration sensor 18 (18*x*, 18*y*, and 18*z*) and the angular velocity sensor (17*x*, 17*y*, and 17*z*) is installed in the sensor unit 100 according to the present embodiment as the physical quantity sensor and thus the sensor unit 100 can measure at least any of acceleration and angular velocity.

Structural Health Monitoring

Figure 17:
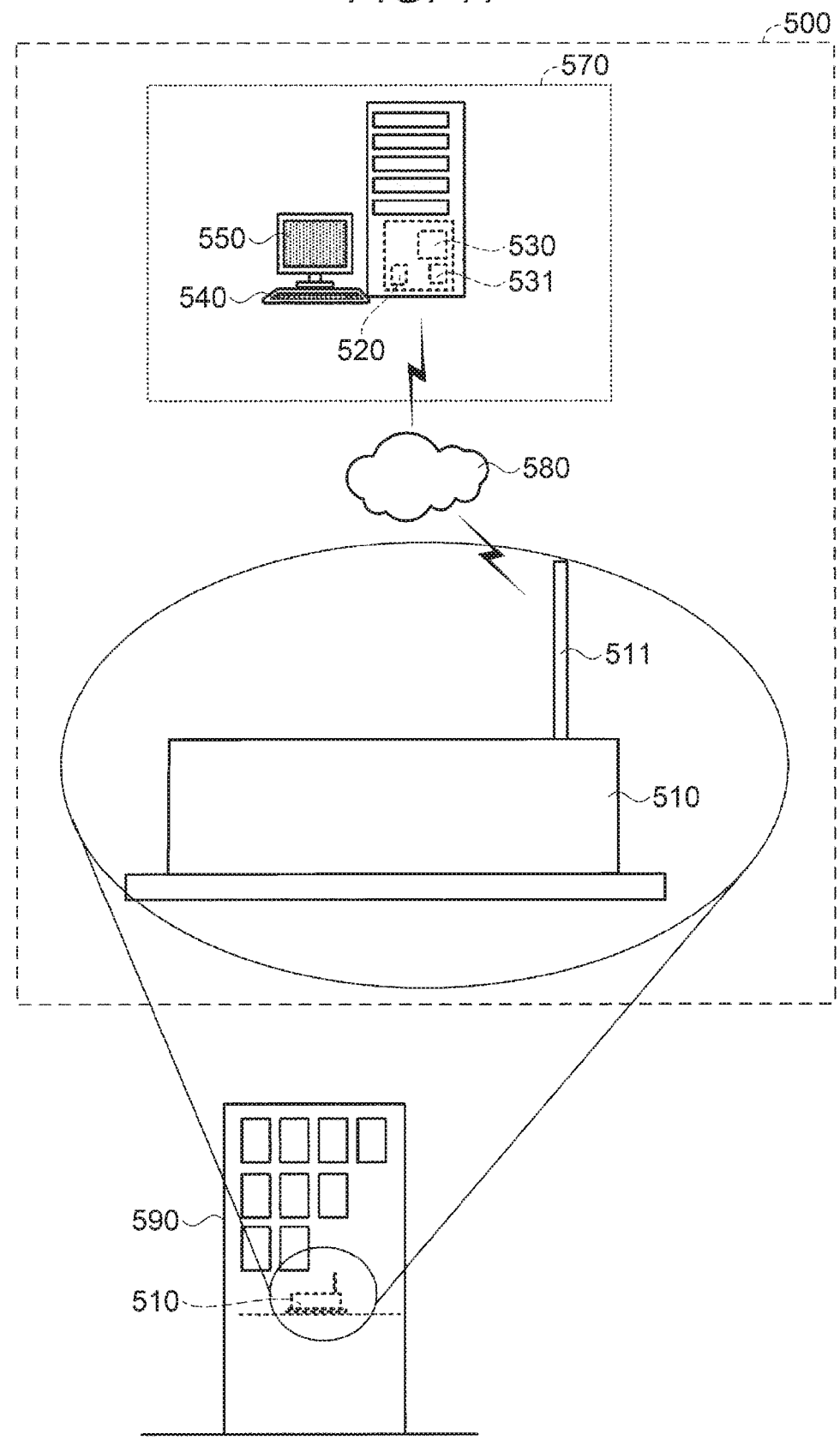
FIG. 17 is a configuration view illustrating a structural health monitoring provided with the sensor unit.

FIG. 17 illustrates a structure health monitoring (SHM) 500. The structural health monitoring 500 includes a physical quantity sensor device 510 that has the same structure as the sensor unit 100 in the above-described embodiment and that is attached to a structure 590, which is a monitoring target. The physical quantity sensor device 510 includes a transmitter 511 that transmits a detection signal. The transmitter 511 may be realized as a communication module or an antenna separated from the physical quantity sensor device 510.

The physical quantity sensor device 510 is connected to a monitoring computer 570 via a wireless or wired communication network 580. The monitoring computer 570 includes a receiver 520 that is connected to the physical quantity sensor device 510 via the communication network 580 and a calculator 530 that calculates the inclination angle of the structure 590 based on a signal output from the receiver 520.

In the present embodiment, the calculator 530 is realized with an application specific integrated circuit (ASIC) or a field programmable gate array (FPGA) installed in the monitoring computer 570. The calculator 530 may be a processor such as a central processing unit (CPU) and the processor may perform arithmetic processing of a program stored in an IC memory 531 such that the calculator 530 is realized in the form of software. The monitoring computer 570 receives various operation inputs of an operator through a keyboard 540 and can display the result of the arithmetic processing on a touch panel 550.

According to the structural health monitoring 500 in the present embodiment, inclination of the structure 590 is monitored by using the sensor unit 100 in the above-described embodiment. Therefore, it is possible to use high-accuracy acceleration measurement, which is the effect of the sensor unit 100, and it is possible to measure inclination of the structure 590, which is the monitoring target, at high accuracy. Therefore, it is possible to improve monitoring quality for the structure 590.

Hereinafter, contents derived from the above-described embodiment will be described as aspects.

Aspect 1

According to the present aspect, there is provided a sensor unit including a physical quantity sensor, a connecter to be coupled to a bonding target portion, a board on which the physical quantity sensor and the connecter are installed, and a container accommodating the board. The board is provided with a first region in which the connecter is installed, a second region in which the physical quantity sensor is installed, and a coupling region that is disposed between the first region and the second region and has a sectional area S3 that is smaller than a sectional area S1 of the first region and a sectional area S2 of the second region in a sectional view as seen in a direction in which the first region and the second region are arranged, and a region in the second region which is on the coupling region side is attached to the container via a fixation member.

In this case, the board is fixed to the container via the fixation member at the region in the second region that is on the coupling region side. Therefore, a stress attributable to bending or the like of the board that is caused by plugging and unplugging of the connecter is released (alleviated) due to a stress releasing effect caused by bending of the coupling region, which is provided between the first region in which the connecter is installed and the second region in which the physical quantity sensor is installed, and thus transmission of the stress to the second region side, on which physical quantity sensor is installed, can be suppressed, the sectional area S3 of the coupling region being smaller than the sectional area S1 of the first region and the sectional area S2 of the second region. Therefore, influence on detection accuracy of the physical quantity sensor, which is generated when a stress caused by plugging and unplugging of the connecter and disposition of the connecter is transmitted to the physical quantity sensor, can be suppressed.

Aspect 2

In the sensor unit, the coupling region may be a constriction portion at which an outer edge of the board extending in a first direction, in which the first region and the second region are arranged, is constricted, as seen in a plan view.

In this case, since the coupling region has a so-called narrow shape in which the outer edge of the board is constricted, bending of the coupling region is likely to occur when a stress is generated on the board due to plugging and unplugging of the connecter and thus it is possible to improve an effect of releasing a stress in the coupling region.

Aspect 3

In the sensor unit, the constriction portion may be provided on each of opposite sides of the board in a second direction orthogonal to the first direction, as seen in a plan view.

In this case, since the constriction portion is provided on each of the opposite sides of the board in the second direction, bending of the coupling region is likely to occur in a good balance and thus it is possible to further improve an effect of releasing a stress in the coupling region.

Aspect 4

In the sensor unit, the coupling region may be a thin portion at which a thickness of an outer edge region of the board extending in a first direction, in which the first region and the second region are arranged, is smaller than that of another region, as seen in a plan view.

In this case, since the coupling region is provided with the thin portion, bending of the coupling region is likely to occur when a stress is generated on the board due to plugging and unplugging of the connecter and thus it is possible to improve an effect of releasing a stress in the coupling region.

Aspect 5

In the sensor unit, the thin portion may be provided on each of opposite sides of the board in a second direction orthogonal to the first direction, as seen in a plan view.

In this case, since the thin portion is provided on each of the opposite sides of the board in the second direction, bending of the coupling region is likely to occur in a good balance and thus it is possible to further improve an effect of releasing a stress in the coupling region.

Aspect 6

In the sensor unit, the coupling region may be provided with a through-hole that is disposed in an outer edge region of the board extending in a first direction, in which the first region and the second region are arranged, as seen in a plan view.

In this case, since the coupling region is provided with the through-hole, bending of the coupling region is likely to occur when a stress is generated on the board due to plugging and unplugging of the connecter and thus it is possible to improve an effect of releasing a stress in the coupling region.

Aspect 7

In the sensor unit, the through-hole may be provided on each of opposite sides of the board in a second direction orthogonal to the first direction, as seen in a plan view.

In this case, since the through-hole is provided on each of the opposite sides of the board in the second direction, bending of the coupling region is likely to occur in a good balance and thus it is possible to further improve an effect of releasing a stress in the coupling region.

Aspect 8

In the sensor unit, a region of the board that surrounds an outer edge of the connecter as seen in a plan view may be attached to the container via the fixation member.

In this case, since the region of the board that surrounds the outer edge of the connecter is attached to the container via the fixation member, intrusion of a foreign matter such as dust or moisture from the vicinity of the connecter exposed to the outside can be prevented.

Aspect 9

In the sensor unit, the fixation member may be an epoxy-based adhesive.

In this case, since the fixation member is an epoxy-based adhesive of which the elastic modulus is smaller than that of the container, it is possible to cause the fixation member to function as a vibration proof member and thus an impact or vibration transmitted to the board as noise vibration after being applied to the container can be suppressed.

Aspect 10

In the sensor unit, the coupling region of the board that is attached to the container via the fixation member may be fixed with a screw.

In this case, it is possible to easily attach and detach the board to and from the container.

Aspect 11

In the sensor unit, the physical quantity sensor may measure at least any of acceleration and angular velocity.

In this case, it is possible to suppress influence of a stress generated due to plugging and unplugging of the connecter or disposition of the connecter and thus it is possible to measure at least any of acceleration and angular velocity at high measurement accuracy.

Aspect 12

According to another aspect, there is provided a structural health monitoring including the sensor unit according to any one of the above-described aspects, a receiver receiving a detection signal from the sensor unit attached to a structure, and a calculator calculating an inclination angle of the structure based on a signal output from the receiver.

In this case, it is possible to provide a structural health monitoring with which it is possible to suppress influence of a stress generated due to plugging and unplugging of the connecter or disposition of the connecter, it is possible to calculate the inclination angle of the structure based on the detection signal from the sensor unit with a high detection accuracy, and thus it is possible to measure the inclination angle at high accuracy.

What is claimed is:

1. A sensor unit comprising:
   a physical quantity sensor;
   a connecter to be coupled to a bonding target portion;
   a board on which the physical quantity sensor and the connecter are installed; and
   a container accommodating the board, wherein
   the board is provided with
      a first region in which the connecter is installed,
      a second region in which the physical quantity sensor is installed, and
      a coupling region that is disposed between the first region and the second region and has a sectional area S3 that is smaller than a sectional area S1 of the first region and a sectional area S2 of the second region in a sectional view as seen in a direction in which the first region and the second region are arranged,
   a region in the second region which is on the coupling region side is attached to the container via a fixation member, and
   the coupling region is a thin portion at which a thickness of an outer edge region of the board extending in a first direction, in which the first region and the second region are arranged, is smaller than that of another region, as seen in a plan view.

2. The sensor unit according to claim 1, wherein the thin portion is provided on each of opposite sides of the board in a second direction orthogonal to the first direction, as seen in a plan view.

3. The sensor unit according to claim 1, wherein the coupling region is provided with a through-hole that is disposed in an outer edge region of the board extending in a first direction, in which the first region and the second region are arranged, as seen in a plan view.

4. The sensor unit according to claim 1, wherein a region of the board that surrounds an outer edge of the connecter as seen in a plan view is attached to the container via the fixation member.

5. The sensor unit according to claim 1, wherein the fixation member is an epoxy-based adhesive.

6. The sensor unit according to claim 1, wherein the coupling region of the board that is attached to the container via the fixation member is fixed with a screw.

7. The sensor unit according to claim 1, wherein the physical quantity sensor measures at least any of acceleration and angular velocity.

8. A structural health monitoring comprising:
   the sensor unit according to claim 1;
   a receiver receiving a detection signal from the sensor unit attached to a structure; and
   a calculator calculating an inclination angle of the structure based on a signal output from the receiver.

9. The sensor unit according to claim 3, wherein the through-hole is provided on each of opposite sides of the board in a second direction orthogonal to the first direction, as seen in a plan view.

* * * * *